(12) United States Patent
Tanase et al.

(10) Patent No.: US 8,503,033 B2
(45) Date of Patent: Aug. 6, 2013

(54) METHOD FOR MANUFACTURING PRINTING DEVICE

(75) Inventors: Kazuyoshi Tanase, Matsumoto (JP); Toru Miyamoto, Shiojiri (JP); Toru Takahashi, Azumino (JP); Hirokazu Kasahara, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 417 days.

(21) Appl. No.: 12/965,385

(22) Filed: Dec. 10, 2010

(65) Prior Publication Data

US 2011/0138608 A1    Jun. 16, 2011

(30) Foreign Application Priority Data

Dec. 10, 2009  (JP) ................. 2009-280083

(51) Int. Cl.
*G06K 15/00*  (2006.01)
(52) U.S. Cl.
USPC .......... 358/3.06; 358/3.13; 358/3.22; 347/12; 347/14
(58) Field of Classification Search
USPC ............ 358/3.06, 3.13, 3.22; 347/12, 14
See application file for complete search history.

(56) References Cited

U.S. PATENT DOCUMENTS

| 7,419,238 | B2 | 9/2008 | Yoshida | |
|---|---|---|---|---|
| 2006/0193010 | A1 | 8/2006 | Kakutani | |
| 2007/0153333 | A1* | 7/2007 | Kakutani | 358/3.13 |
| 2010/0118077 | A1* | 5/2010 | Kakutani | 347/12 |
| 2010/0141699 | A1* | 6/2010 | Yamazaki et al. | 347/15 |

FOREIGN PATENT DOCUMENTS

| JP | 2005-224976 A | 8/2005 |
|---|---|---|
| JP | 2007-15359 A | 1/2007 |
| JP | 2007-174272 A | 7/2007 |

* cited by examiner

*Primary Examiner* — Twyler Haskins
*Assistant Examiner* — Michael Burleson
(74) *Attorney, Agent, or Firm* — Nutter McClennen & Fish LLP; John J. Penny, Jr.

(57) ABSTRACT

A dither mask is used in a halftone process that is performed by the printer that includes the preceding and following heads. The dither mask includes preceding and following head storage regions. The preceding head storage region is used for a printing portion of the preceding head. The following head storage region is used for a printing portion of the following head. The dither mask is generated by determining, using comprehensive evaluation values, storage elements in which thresholds are to be stored under the condition that dots are permitted to be formed by the preceding and following heads at the same position in the region corresponding the overlapping regions.

16 Claims, 26 Drawing Sheets

| SEGMENTED AREA | NUMBER OF STORAGE ELEMENTS | NUMBER OF STORED THRESHOLDS | THRESHOLD SETTING RATIO (%) | DIFFERENCE FROM MINUMUM VALUE (%) |
|---|---|---|---|---|
| A1 | 20 | 3 | 15 | 0 |
| A2 | 25 | 6 | 24 | 9 |
| A3 | 20 | 4 | 20 | 5 |
| A4 | 25 | 6 | 24 | 9 |

FIG. 10

| (A) RASTER NUMBER | (B) NUMBER (ACTUAL NUMBER) OF THRESHOLD-STORED STORAGE ELEMENTS | | | (C) IDEAL ASSIGNMENT VALUE =THRESHOLD STORAGE RATE ×(NUMBER OF THRESHOLD-STORED STORAGE ELEMENTS OF RASTER+1) | | (D) THRESHOLD STORAGE RATE (%) | |
|---|---|---|---|---|---|---|---|
| | NUMBER OF THRESHOLD-STORED STORAGE ELEMENTS | FOLLOWING HEAD | PRECEDING HEAD | FOLLOWING HEAD | PRECEDING HEAD | FOLLOWING HEAD | PRECEDING HEAD |
| 1 | 21 | 10 | 11 | 11 | 11 | 50 | 50 |
| 2 | 22 | 12 | 10 | 11.5 | 11.5 | 50 | 50 |
| 3 | 20 | 8 | 12 | 10.5 | 10.5 | 50 | 50 |
| 4 | 22 | 10 | 12 | 11.5 | 11.5 | 50 | 50 |

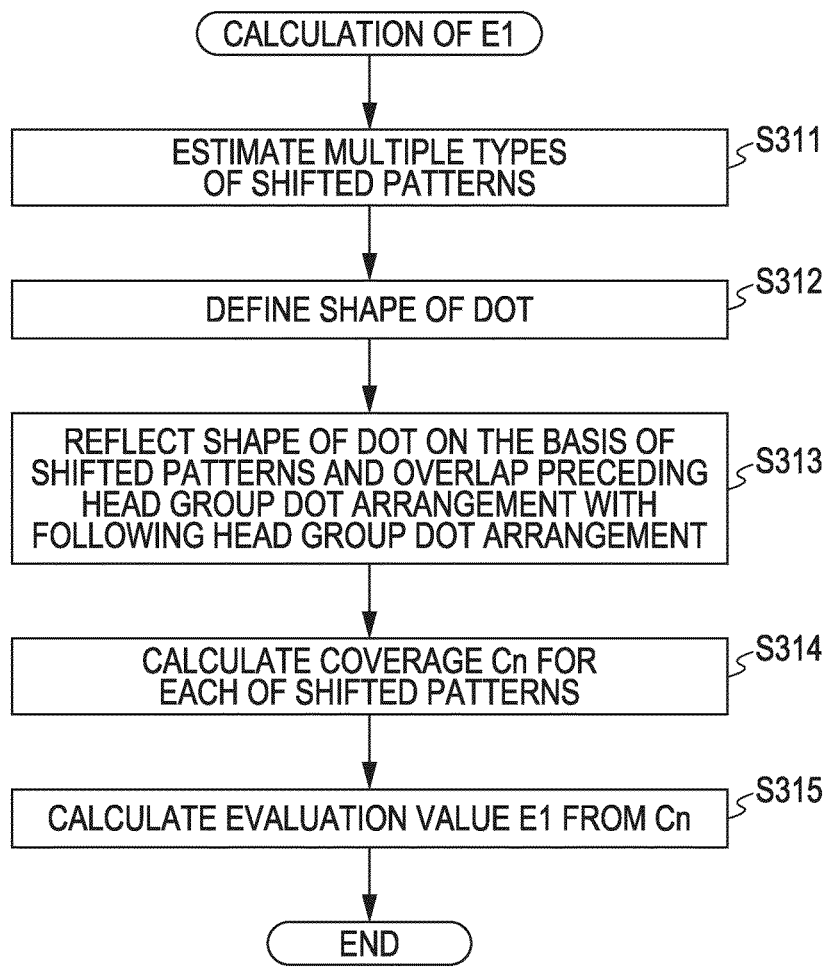

FIG. 16A

DIRECTION IN WHICH SHEET IS TRANSPORTED ←

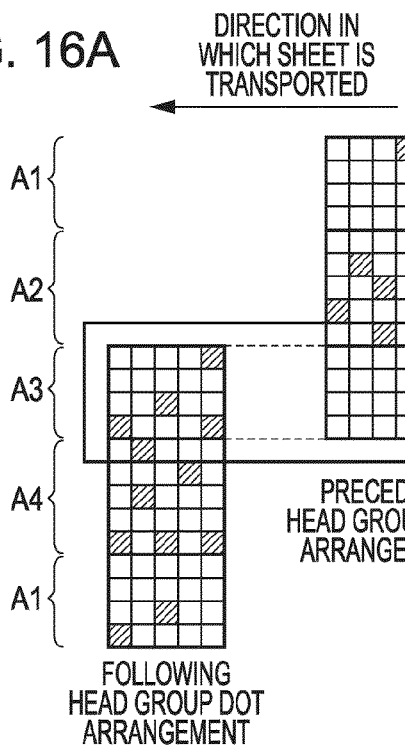

FIG. 16B

PATTERN 1

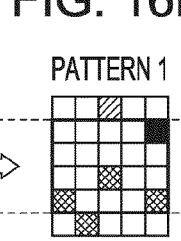

OVERLAPPING
(NO DOT IS SHIFTED)

FIG. 16C

PATTERN 2

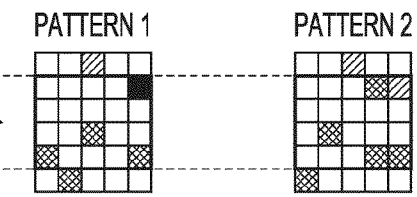

OVERLAPPING
(FOLLOWING HEAD DOT GROUP ARRANGEMENT: DOTS ARE SHIFTED BY 1 PIXEL IN DIRECTION IN WHICH SHEET IS TRANSPORTED)

FIG. 16D

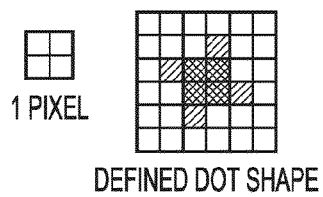

1 PIXEL    DEFINED DOT SHAPE

FIG. 16E

PATTERN 1
(DEFINED DOT SHAPE IS REFLECTED)

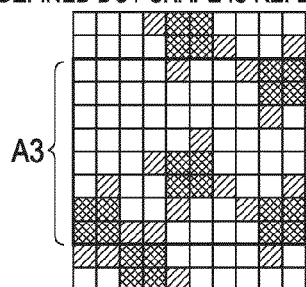

REGION TO BE EVALUATED

PATTERN 2
(DEFINED DOT SHAPE IS REFLECTED)

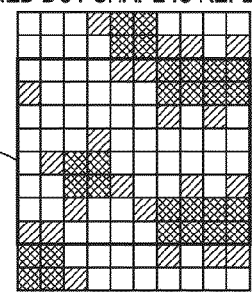

COVERAGE C1=28/80×100=35.0

COVERAGE C2=34/80×100=42.5

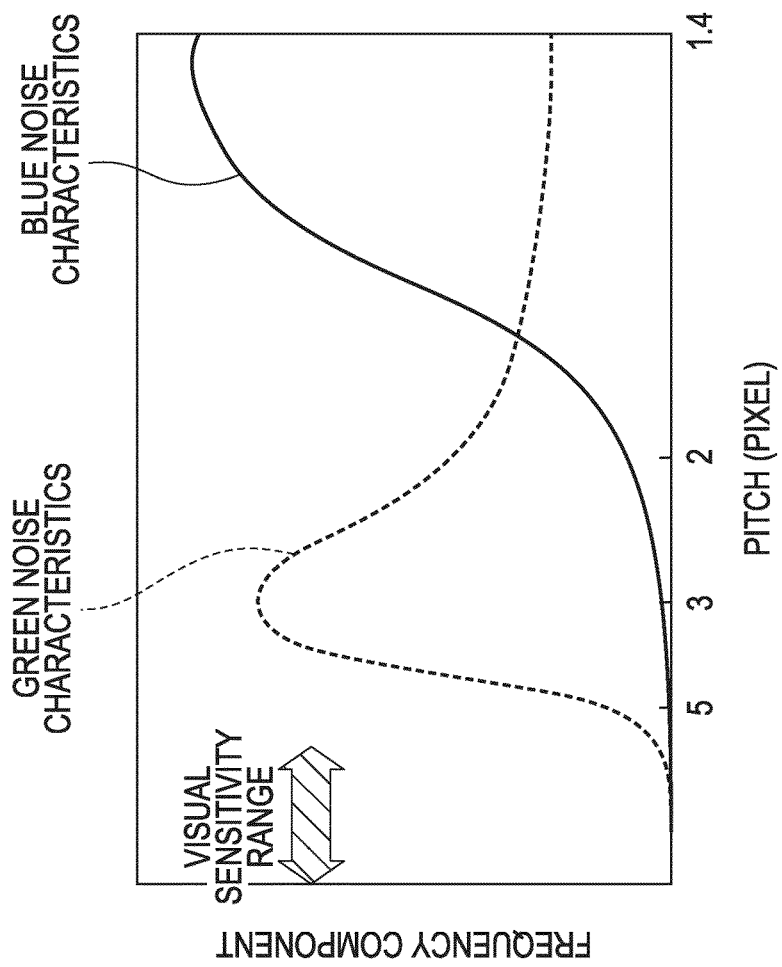

$$VTF(u) = 5.05 \cdot \exp\left(\frac{-0.138\pi L \cdot u}{180}\right) \cdot \left\{1 - \exp\left(\frac{-0.1\pi L \cdot u}{180}\right)\right\}$$

$$\text{GRANURALITY INDEX} = K \int FS(u) \cdot VTF(u) \, du$$

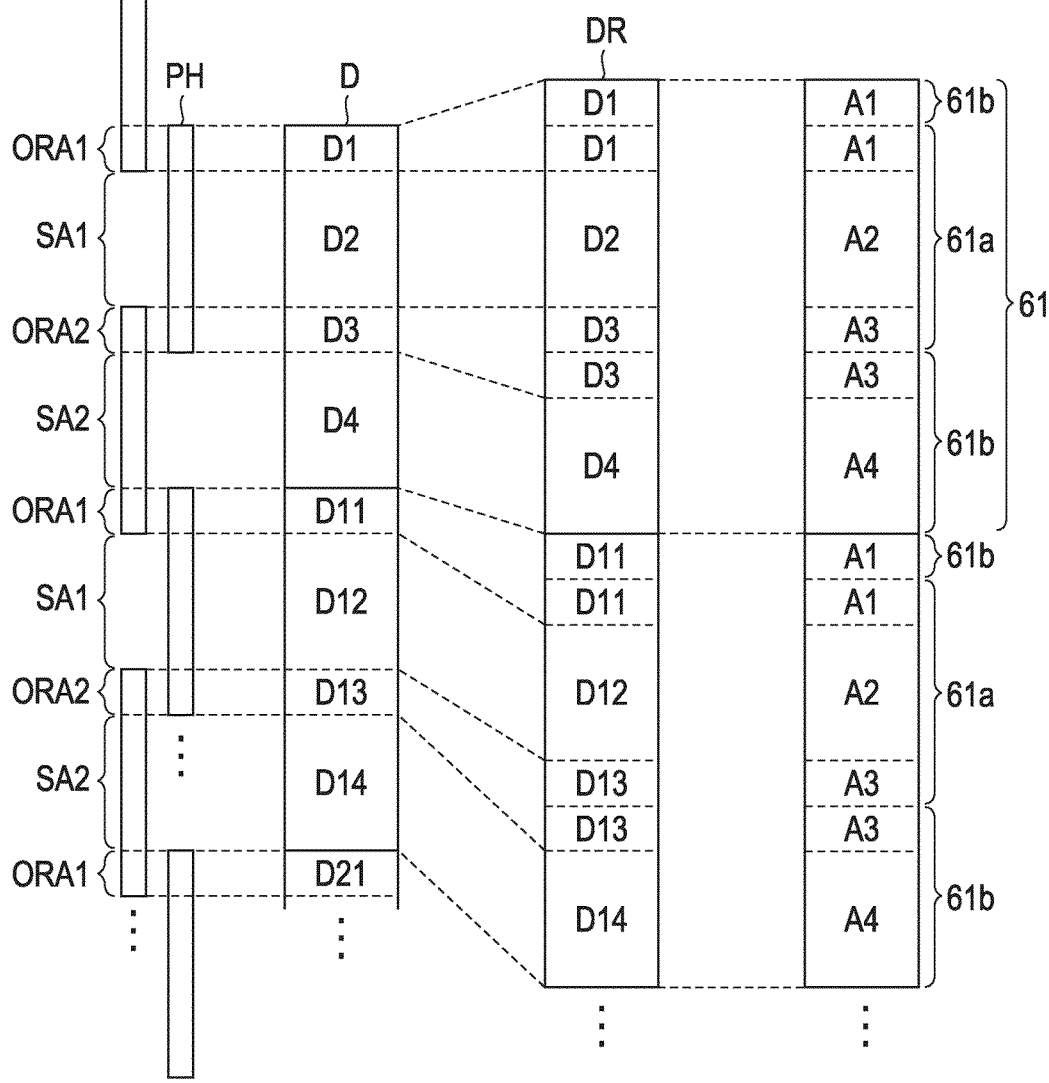

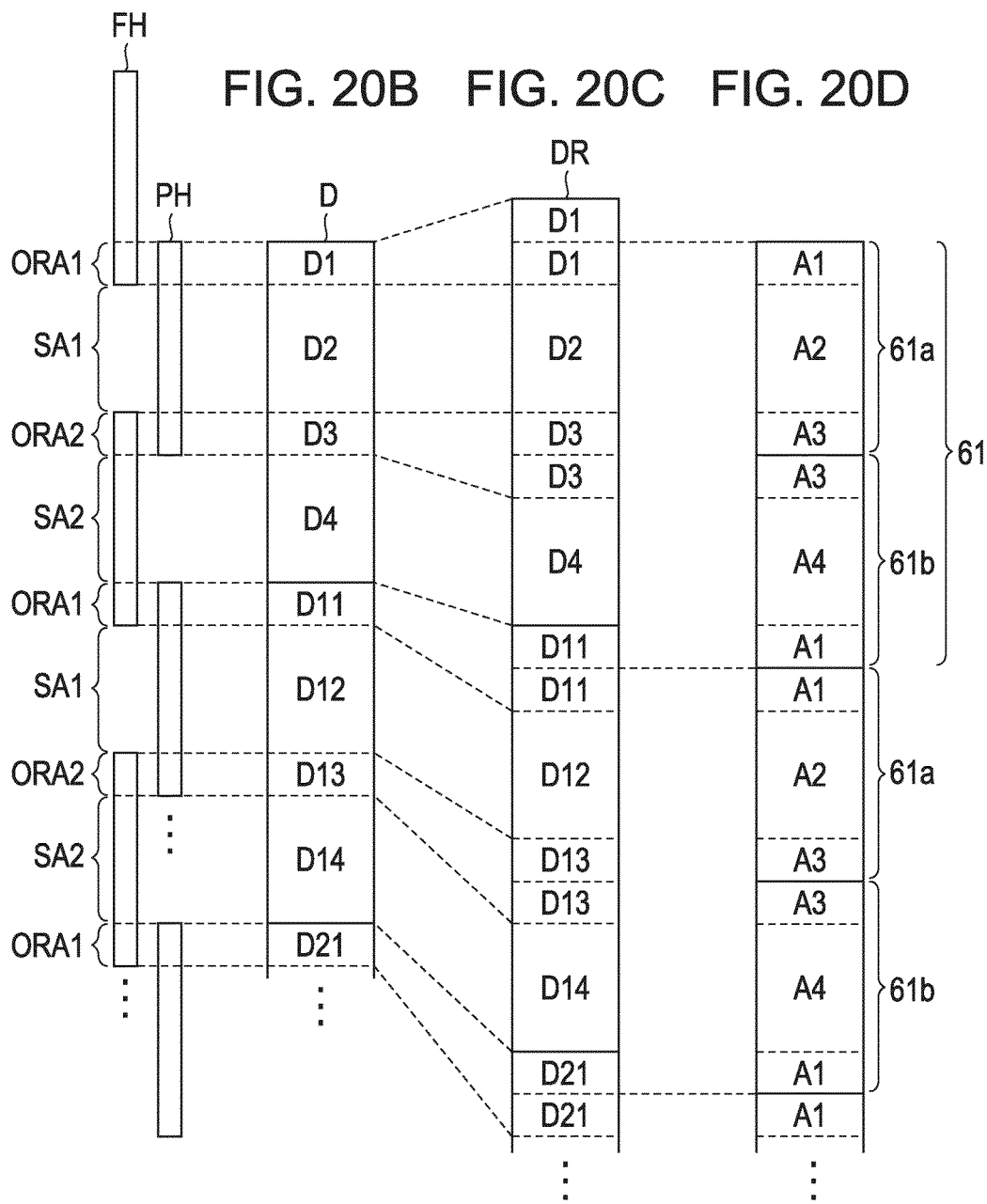

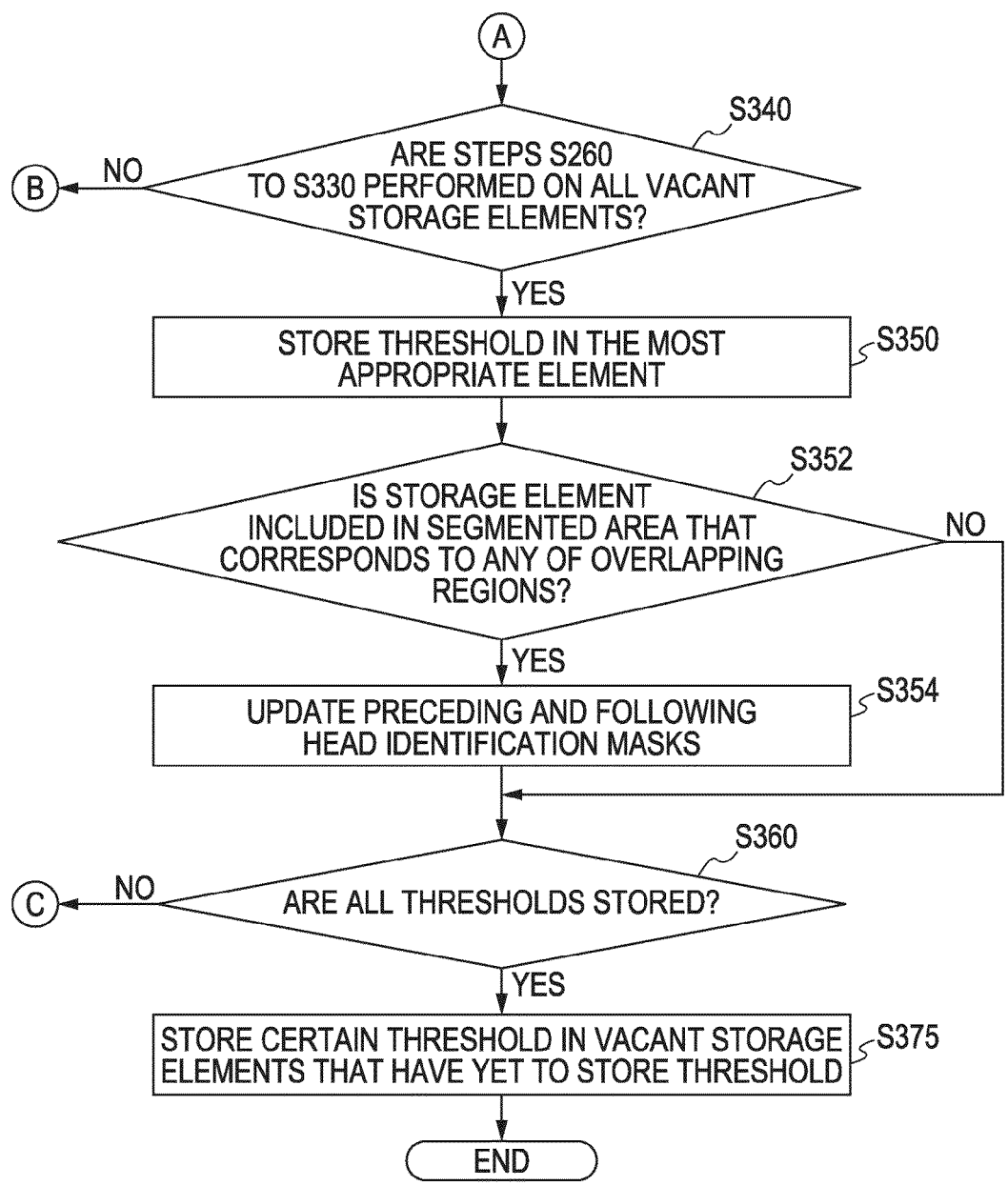

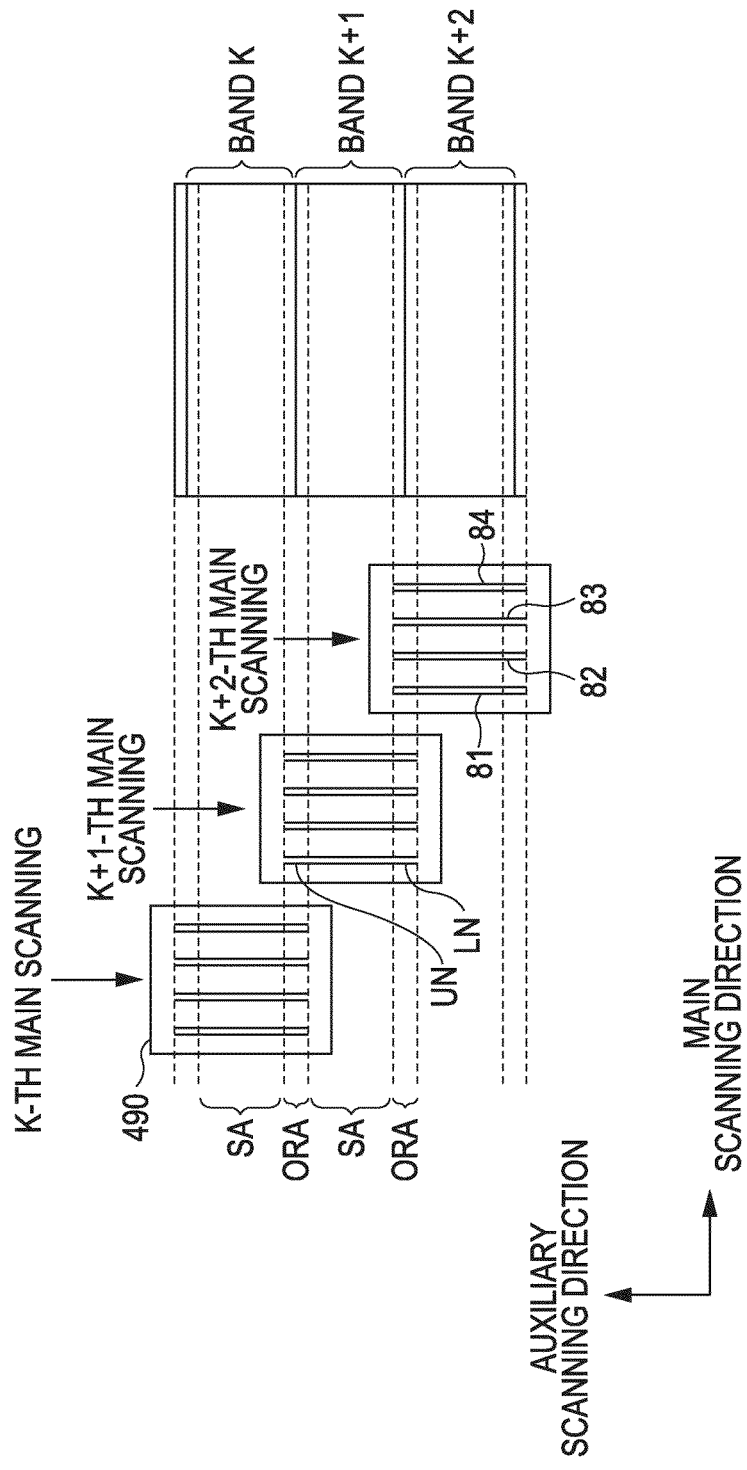

FIG. 26A

DIRECTION IN WHICH SHEET IS TRANSPORTED

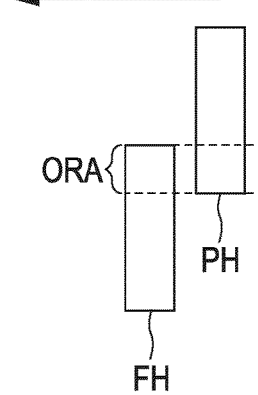

FIG. 26B

CONVENTIONAL METHOD

FINAL DOT ARRANGEMENT
(NO DOT IS SHIFTED)

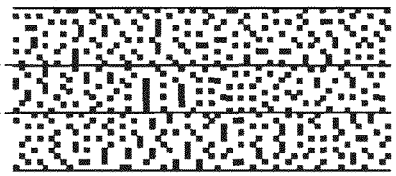

PRECEDING HEAD GROUP
DOT ARRANGEMENT

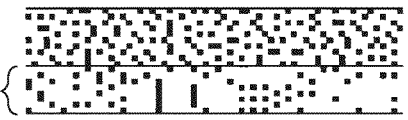

FOLLOWING HEAD GROUP
DOT ARRANGEMENT

FINAL DOT ARRANGEMENT
(DOTS SHIFTED BY THREE PIXELS IN DIRECTION IN WHICH SHEET IS TRANSPORTED)

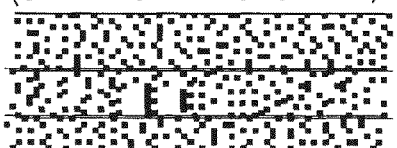

FIG. 26C

METHOD ACCORDING TO EMBODIMENT OR ANY OF MODIFIED EXAMPLES

FINAL DOT ARRANGEMENT
(NO DOT IS SHIFTED)

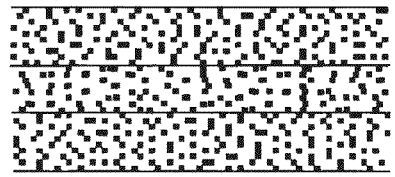

PRECEDING HEAD GROUP
DOT ARRANGEMENT

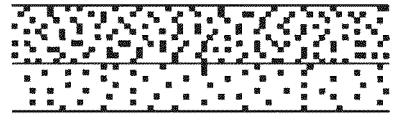

FOLLOWING HEAD GROUP
DOT ARRANGEMENT

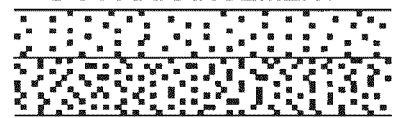

FINAL DOT ARRANGEMENT
(DOTS SHIFTED BY THREE PIXELS IN DIRECTION IN WHICH SHEET IS TRANSPORTED)

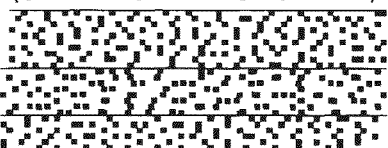

IMAGE USED FOR EVALUATION

RESULT PRINTED BY CONVENTIONAL METHOD

}ORA

RESULT PRINTED BY METHOD ACCORDING TO EMBODIMENT OR ANY OF MODIFIED EXAMPLES

}ORA

METHOD FOR MANUFACTURING PRINTING DEVICE

CROSS REFERENCES TO RELATED APPLICATIONS

The entire disclosure of Japanese Patent Application No. 2009-280083, filed Dec. 10, 2009 is expressly incorporated by reference herein.

BACKGROUND

1. Technical Field

The present invention relates to a method for generating a dither mask that is used in a halftone process in a printing device.

2. Related Art

An ink jet line printer performs printing while transporting a printing sheet by ejecting ink onto the printing sheet from nozzles of printing heads that are arranged across the entire width of the printing sheet in a direction crossing the direction in which the printing sheet is transported. The printer typically includes a plurality of the printing heads. In addition, the printing heads are arranged so that regions (hereinafter also referred to as overlapping regions) of adjacent printing heads overlap each other in a direction in which the printing heads are arranged. The adjacent printing heads eject ink from the overlapping regions and form an image on the printing sheet.

An irregularity in the density of the image or a reduction in granularity may occur in a portion of the image formed by the line printer in a region that corresponds to the overlapping regions. These problems occur due to the fact that: ink is ejected from the nozzles of the printing heads; dots are formed on the printing sheet and shifted from target positions; and an irregularity in the density of dots is locally present due to the shifting of the dots. The shifting of the ink dots from the target positions may caused by the fact that the attached printing heads are misaligned from appropriate positions due to a problem with the attachment accuracy or by the fact that a distance that the printing sheet is transported is not exactly constant due to a problem with mechanical accuracy.

Those problems not only occur in line printers but also may occur in a band-pass scanning type serial ink jet printer that completes a raster by performing main scanning mainly once and has overlapping portions that complete a raster by partially performing main scanning twice. This is due to the fact that the aforementioned problem with the accuracy of transporting a printing sheet also occurs in the serial ink jet printer.

SUMMARY

An advantage of some aspects of the invention is that it improves the quality of an image that is printed by printing heads that overlap each other or is printed by performing main scanning two times in a printing region that corresponds to overlapping regions in a line printer or a band-pass scanning type serial ink jet printer.

The invention has been devised to solve at least a part of the aforementioned problems and can be realized in the following embodiment and aspects.

According to a first aspect of the invention, a method for manufacturing a printing device that includes a dither mask that is used in a halftone process and in which thresholds are stored in a plurality of storage elements includes: configuring the printing device that has a plurality of printing heads arranged in a printing region so that a region of a first one of the printing heads and a region of a second one of the printing heads are adjacent to each other and overlap each other in a direction in which the printing heads are arranged, other regions of the first and second printing heads do not overlap each other in the direction in which the printing heads are arranged, and the printing heads perform printing and eject ink while moving the printing heads relative to the printing medium; assigning, to some of the storage elements of the dither mask, a first dither mask region that is used for a printing portion of the first printing head, and assigning, to the other storage elements of the dither mask, a second dither mask region that is used for a printing portion of the second printing head, the printing portion of the first printing head being configured to perform printing and included in the overlapping region and non-overlapping region of the first printing head, the printing portion of the second printing head being configured to perform printing and included in the overlapping region and non-overlapping region of the second printing head; preparing predetermined evaluation values that are used to evaluate the dither mask and each vary depending on whether a threshold that is used for any of the overlapping regions is stored in the first dither mask region or the second dither mask region; generating the dither mask by determining, using the predetermined evaluation values, the storage elements in which the thresholds are to be stored under the condition that dots are permitted to be formed by the first and second printing heads at the same position in a printing region that corresponds to the overlapping regions; and storing the generated dither mask in a storage medium of the printing device so that a computer is capable of reading the dither mask.

The dither mask that is generated by the method according to the first aspect includes: the first dither mask region that is used for the printing portion of the first printing head; and the second dither mask region that is used for the printing portion of the second printing head. The evaluation values each vary depending on whether the threshold is stored in the first dither mask region or the second dither mask region. The storage elements in which the thresholds are to be stored are determined using the evaluation values. The first and second dither mask regions of the dither mask have storage elements that correspond to the overlapping regions. The dither mask and assignment information that indicates whether the first or second printing head forms a dot can be simultaneously generated in a series of processes.

As a result, the dither mask and the assignment information can be generated while the balance of assigning, to the printing heads, dot patterns (for each gradation) that are formed by means of the dither mask and corresponds to the overlapping regions is controlled. When the halftone process is performed using the dither mask and the assignment information that are generated in the aforementioned manner, it is possible to suppress an abrupt change (due to a change in the gradations) of assignment to the printing heads in segmented areas that correspond to the overlapping regions. As a result, even when ink dots are formed and shifted from target positions, it is possible to reduce the amount of a variation in densities of dots for each gradation and suppress a reduction in the quality of an image printed in the printing region that corresponds to the overlapping regions. The storage elements in which the thresholds are to be stored are determined under the condition that dots are permitted to be formed by the first printing head and the second printing head at the same position in the printing region that corresponds to the overlapping regions. Thus, it is possible to increase a selection range of a storage element in which a threshold is to be stored. Therefore, it is possible to select a storage element in which a threshold is to be stored and for which an evaluation value has been calculated and is most appropriate among the calculated evaluation values.

According to a second aspect of the invention, in the method according to the first aspect of the invention, it is preferable that the dither mask be generated by: specifying, for each of rasters, a printing rate that is the ratio of the number of dots that form a part of the raster and are to be formed by the first printing head in the printing region corresponding to the overlapping regions to the number of dots that form the other part of the raster and are to be formed by the second printing head in the printing region corresponding to the overlapping regions, the rasters each being a dot line that extends in a direction perpendicular to the direction in which the printing heads are arranged; selecting, as a target threshold, one of the thresholds, which is to be stored in any of vacant storage elements that have yet to store any of the thresholds; selecting, as candidate storage elements, a plurality of candidates for a storage element in which the target threshold is to be stored from among the vacant storage elements included in the first and second dither mask regions on the basis of the printing rates and predetermined requirements that are related to the balance of a dot arrangement, and setting the selected candidate storage elements; calculating a predetermined evaluation value for each of the candidate storage elements on the basis of an assumption that the target threshold is stored in each of the candidate storage elements; and selecting, from among the candidate storage elements, a candidate storage element for which an evaluation value has been calculated and is most appropriate among the calculated evaluation values, and storing the target threshold in the selected candidate storage element, wherein the evaluation values each include an evaluation value obtained by quantifying a variation in dot coverage that is the ratio of the area of dots to be formed in the printing region that corresponds to the overlapping regions to the area of the printing region that corresponds to the overlapping regions, the variation in the dot coverage being caused by dots that are formed on the printing medium by the first and second printing heads and shifted from each other in a predetermined direction by a predetermined distance, the shifting being caused by the difference between the first and second printing heads, and wherein the selection of one of the thresholds, the selection and setting of a plurality of the candidate storage elements, the calculation of the predetermined evaluation values, and the selection and storage of one of the candidate storage elements are repeated predetermined times so that the dither mask is generated.

In the method according to the second aspect of the invention, the candidate storage elements are selected and set on the basis of the printing rates and the predetermined requirements that are related to the balance of the dot arrangement. A storage element in which the target threshold is to be stored is selected on the basis of the evaluation value calculated for each of the candidate storage elements. The evaluation values are each obtained by quantifying the variation in the dot coverage. The candidate storage elements can be evaluated in order to reduce the variation (caused by ink dots that are formed and shifted) in the dot coverage or a variation in densities of formed dots. Even when the formed ink dots are shifted, the dither mask that can suppress a variation (caused by the dots that are formed and shifted) in densities of dots can be generated. The storage elements in which the target thresholds are to be stored are determined under the condition that dots are permitted to be formed by the first and second printing heads at the same position in the printing region corresponding to the overlapping regions. Therefore, it is possible to control a wide range of the dot coverage and appropriately evaluate the candidate storage elements on the basis of the variation in the dot coverage. In addition, when the evaluation values are calculated for the candidate storage elements selected under the aforementioned conditions, the number of the evaluation values to be calculated can be reduced, and the dither mask can be efficiently generated.

According to a third aspect of the invention, in the method according to the second aspect of the invention, it is preferable that when the target threshold is stored in one of the vacant storage elements, the predetermined requirements be that: the first proportion of storage elements that have the thresholds stored therein among storage elements included in each of areas is set to a value so that the difference between the smallest and largest first proportions is minimized, the areas being segmented on the basis of differences between the non-overlapping regions and the overlapping regions and of differences between a printing region that corresponds to parts that are included in the printing portions of the first and second printing heads and in the overlapping regions and perform printing, and printing regions that correspond to the other parts that are included in the printing portions of the first and second printing heads and in the non-overlapping regions and perform printing; the second proportion of storage elements that have the thresholds stored therein among the storage elements that correspond to the overlapping regions and each of the rasters is set to a value so that the difference between the smallest and largest second proportions is minimized; and a second printing rate that is the ratio of the number of storage elements that are used for the first printing head and have the thresholds stored therein and correspond to each of the rasters to the number of storage elements that are used for the second printing head and have the thresholds stored therein and correspond to each of the rasters is set to a value so that differences between the specified printing rates and the second printing rates are minimized.

In the method according to the third aspect of the invention, the candidate storage elements are set under the condition that: the balance of the storage elements is optimized for each of the segmented areas; the balance of the storage elements is optimized for each of the rasters; and the consistency with the printing rate is optimized for each of the rasters. Thus, the balance of dots that are to be formed in the printing region corresponding to the overlapping regions can be controlled with high accuracy. As a result, the dither mask that can suppress a variation (caused by ink dots that are formed and shifted) in densities of dots can be generated. The candidate storage elements can be limited to an extremely small number of elements on the basis of the aforementioned requirements. Thus, the number of the evaluation values can be reduced, and the dither mask can be efficiently generated.

According to a fourth aspect of the invention, in the method according to the second aspect of the invention, it is preferable that when the target threshold is stored in one of the vacant storage elements, the predetermined requirements be that: the first proportion of storage elements that have the thresholds stored therein among storage elements included in each of areas is in a predetermined range from a value, set so that the first proportions are equal to each other, to a predetermined value, the areas being segmented on the basis of differences between the non-overlapping regions and the overlapping regions and of differences between a printing region that corresponds to parts that are included in the printing portions of the first and second printing heads and in the overlapping regions and perform printing, and printing regions that correspond to the other parts that are included in the printing portions of the first and second printing heads and in the non-overlapping regions and perform printing; the second proportion of storage elements that have the thresholds stored therein among the storage elements that correspond to the overlapping regions and each of the rasters is in a predetermined range from a value, set so that the second proportions are equal to each other, to a predetermined value; and a second printing rate that is the ratio of the number of storage elements that are used for the first printing head and have the thresholds stored therein and correspond to each of the rasters to the number of storage elements that are used for the second printing head and have the thresholds stored therein and correspond to each of the rasters is in a predetermined range from the printing rate specified for the raster to a predetermined value.

In the method according to the fourth aspect of the invention, the candidate storage elements are set under the condition that: the balance of the storage elements is set in the predetermined range for each of the segmented areas; the balance of the storage elements is set in the predetermined range for each of the rasters; and the consistency with the set printing rate is within the predetermined range for each of the rasters. Thus, the number of the candidate storage elements is increased compared with the method according to the third aspect of the invention. A storage element for which an evaluation value has been calculated and is most appropriate among the calculated evaluation values can be selected from among a wide range of the candidate storage elements while the balance of dots to be formed in the printing region corresponding to the overlapping regions can be controlled. Therefore, the effect of reducing a variation (caused by ink dots that are formed and shifted) in densities of dots can be increased compared with the method according to the third aspect of the invention.

According to a fifth aspect of the invention, in the method according to the third aspect of the invention, it is preferable that the predetermined evaluation values be calculated on the basis of an assumption that the target element is stored in one of the vacant storage elements, and each include: a distribution evaluation value that indicates a distribution of dots that are to be formed by the first or second printing head on the basis of a dot arrangement of storage elements that have the thresholds stored therein and are included in the first or second dither mask region that includes the selected candidate storage element, the first or second printing head corresponding to the first or second dither mask region that includes the selected candidate storage element; and a coverage evaluation value that is obtained by estimating a plurality of types of shifted patterns that each indicate a state in which dots are to be formed on the printing medium by the first and second printing heads and shifted from each other in a predetermined direction by a predetermined distance due to the difference between the first and second printing heads, calculating, for each of the shifted patterns, the dot coverage in the printing region corresponding to the overlapping regions, and quantifying the variation in the dot coverage.

In the method according to the fifth aspect of the invention, the evaluation values each include the distribution evaluation value that indicates a distribution of dots to be formed by the first or second printing head (corresponding to the first or second dither mask region that includes the selected candidate storage element) on the basis of a dot arrangement of storage elements that have the thresholds stored therein and are included in the first or second dither mask region that includes the selected candidate storage element. The candidate storage elements are evaluated using the evaluation values that each include the distribution evaluation value. Thus, the dither mask can be generated, which ensures a distribution of dots formed in printing regions corresponding to the non-overlapping regions and an excellent image formed in the printing regions corresponding to the non-overlapping regions. In addition, the candidate storage elements are evaluated using the evaluation values. The evaluation values are calculated for the plurality of types of shifted patterns, respectively, and each include the coverage evaluation value that is obtained by quantifying the variation in the dot coverage in the printing region that corresponds to the overlapping regions. Thus, the dither mask can be generated, which can reduce, by a certain amount, a variation in densities of dots formed in the printing region corresponding to the overlapping region and suppress a reduction (caused by ink dots that are formed and shifted) in the quality of a printed image even when any of the shifted patterns occur.

According to a sixth aspect of the invention, in the method according to the fifth aspect of the invention, it is preferable that the shifted patterns include a pattern in which no dot is shifted.

In the method according to the sixth aspect of the invention, the dither mask can be generated, which ensures an excellent printed result even when no ink dot is shifted.

According to a seventh aspect of the invention, in the method according to the fifth aspect of the invention, it is preferable that the coverage evaluation value indicate the variation in the dot coverage that is calculated for each of the plurality of types of shifted patterns.

In the method according to the seventh aspect of the invention, the candidate storage elements can be evaluated on the basis of the variation in the dot coverage calculated for each of the plurality of types of shifted patterns. Even when any of the estimated shifted patterns occur, the dither mask can be generated, which suppresses a variation in the dot coverage or a variation in densities of dots. Thus, even when formed ink dots are shifted, the quality of an image formed in the printing region that corresponds to the overlapping region is not significantly reduced.

According to an eighth aspect of the invention, in the method according to the first aspect of the invention, it is preferable that the printing device include a function of correcting an irregularity in the density of a printed image, the irregularity being caused by the difference between the plurality of printing heads and generated in a direction crossing a direction in which a raster extends.

An irregularity in the density of dots formed in the printing region that corresponds to the overlapping regions may be caused by dots shifted by constant amounts due to misalignment of the printing heads or the like or may be caused by dots shifted by amounts (due to a problem with the accuracy of transporting a printing sheet) that vary for each printing operation. In the method according to the eighth aspect of the invention, since the printing device has the density correcting function, the printing device can suppresses the occurrence of an irregularity (caused by dots shifted by constant amounts) in the density of dots by means of the density correcting function. When printing is performed using the dither mask that is generated by the method according to the first aspect of the invention, the effect of suppressing the occurrence of an irregularity in the density of dots can be further increased by the effect of the dither mask generated by the method according to the eighth aspect of the invention. In other words, when the printing device that includes the density correcting function performs printing using the dither mask generated by the method according to the first aspect of the invention, an acceptable range of a distance between dots that are formed and shifted from each other, which is provided to make an irregularity in the density of dots unnoticeable, can be increased.

In addition, the following methods for generating a dither mask can be achieved and have effects that are the same as or similar to the effects of the methods according to the first to eighth aspects of the invention.

According to a ninth aspect of the invention, a method for generating a dither mask that has thresholds in storage elements and is used in a halftone process in which a printing device that has a non-overlapping region and an overlapping region, ejects ink while moving a printing head relative to a printing medium in a main scanning direction and an auxiliary scanning direction, forms a part of a raster by performing main scanning one time in a region corresponding to the non-overlapping region, forms the other part of the raster by performing main scanning two times in a region corresponding to the overlapping region, the raster being a dot line that extends in the main scanning direction, includes: assigning, to some of the storage elements of the dither mask, a first dither mask region that is used for a printing portion that is included in the overlapping region and the non-overlapping region and performs printing with the first main scanning, and assigning, to the other storage elements of the dither mask, a second dither mask region that is used for a printing portion that is included in the overlapping region and the non-overlapping region and performs printing with the second main scanning; preparing predetermined evaluation values that are used to evaluate the dither mask and each vary depending on whether a threshold that is used for the overlapping region is stored in the first dither mask region or the second dither mask region; and generating the dither mask by determining, using the predetermined evaluation values, the storage elements in which the thresholds are to be stored under the condition that dots are permitted to be formed by the first and second main scanning at the same position in the printing region that corresponds to the overlapping region.

According to a tenth aspect of the invention, in the method according to the ninth aspect of the invention, it is preferable that the dither mask be generated by: specifying, for each of rasters, a printing rate that is the ratio of the number of dots that form a part of the raster and are to be formed by the first main scanning in the printing region corresponding to the overlapping region to the number of dots that form the other part of the raster and are to be formed by the second main scanning in the printing region corresponding to the overlapping region; selecting, as a target threshold, one of the thresholds, which is to be stored in any of vacant storage elements that have yet to store any of the thresholds; selecting, as candidate storage elements, a plurality of candidates for a storage element in which the target threshold is to be stored from among the vacant storage elements included in the first and second dither mask regions on the basis of the printing rates and predetermined requirements that are related to the balance of a dot arrangement, and setting the selected candidate storage elements; calculating a predetermined evaluation value for each of the candidate storage elements on the basis of an assumption that the target threshold is stored in each of the candidate storage elements; and selecting, from among the candidate storage elements, a candidate storage element for which an evaluation value has been calculated and is most appropriate among the calculated evaluation values, wherein the evaluation values each include an evaluation value obtained by quantifying a variation in dot coverage that is the ratio of the area of dots to be formed on the printing medium in the printing region corresponding to the overlapping region to the area of the printing region corresponding to the overlapping region, the variation in the dot coverage being caused by dots that are formed on the printing medium by the first and second scanning and shifted from each other in a predetermined direction by a predetermined distance, the shifting being caused by the difference between the first scanning and the second scanning, and wherein the selection of one of the thresholds, the selection and setting of a plurality of the candidate storage elements, the calculation of the predetermined evaluation values, and the selection and storage of one of the candidate storage elements are repeated predetermined times so that the dither mask is generated.

According to an eleventh aspect of the invention, in the method according to the tenth aspect of the invention, it is preferable that when the target threshold is stored in one of the vacant storage elements, the predetermined requirements be that: the first proportion of storage elements that have the thresholds stored therein among storage elements included in each of areas is set to a value so that the difference between the smallest and largest first proportions is minimized, the areas being segmented on the basis of the difference between the non-overlapping region and the overlapping region and of the difference between a region formed by the main scanning performed by a portion of the printing head and a region formed by the first and second main scanning performed by the printing portions of the printing head; the second proportion of storage elements that have the thresholds stored therein among the storage elements that correspond to the overlapping region and each of the rasters is set to a value so that the difference between the smallest and largest second proportions is minimized; and a second printing rate that is the ratio of the number of storage elements that are used for the region in which the printing is performed with the first main scanning and have the thresholds stored therein and correspond to each of the rasters to the number of storage elements that are used for the region in which the printing is performed with the second main scanning and have the thresholds stored therein and correspond to each of the rasters is set to a value so that differences between the specified printing rates and the second printing rates are minimized.

According to a twelfth aspect of the invention, in the method according to the tenth aspect of the invention, it is preferable that when the target threshold is stored in one of the vacant storage elements, the predetermined requirements be that: the first proportion of storage elements that have the thresholds stored therein among storage elements included in each of areas is in a predetermined range from a value, set so that the first proportions are equal to each other, to a predetermined value, the areas being segmented on the basis of the difference between the non-overlapping region and the overlapping region and of the difference between a region formed by the main scanning performed by a portion of the printing head and a region formed by the first and second main scanning performed by the printing portions of the printing head; the second proportion of storage elements that have the thresholds stored therein among the storage elements that correspond to the overlapping region and each of the rasters is in a predetermined range from a value, set so that the second proportions are equal to each other, to a predetermined value; and a second printing rate that is the ratio of the number of storage elements that are used for the region in which the printing is performed with the first main scanning and have the thresholds stored therein and correspond to each of the rasters to the number of storage elements that are used for the region in which the printing is performed with the second main scanning and have the thresholds stored therein and correspond to each of the rasters is in a predetermined range from the printing rate specified for the raster to a predetermined value.

According to a thirteen aspect of the invention, in the method according to the eleventh aspect of the invention, it is preferable that the predetermined evaluation values be calculated on the basis of an assumption that the target element is stored in one of the vacant storage elements, and each include: a distribution evaluation value that indicates a distribution of dots to be formed by the main scanning on the basis of a dot arrangement of storage elements that have the thresholds stored therein and are included in the first or second dither mask region that includes the selected candidate storage element, the main scanning corresponding to the first or second dither mask region that includes the selected candidate storage element; and a coverage evaluation value that is obtained by estimating a plurality of types of shifted patterns that each indicate a state in which dots are to be formed on the printing medium by the first and second main scanning and shifted from each other in a predetermined direction by a predetermined distance due to the difference between the first and second main scanning, calculating, for each of the shifted patterns, the dot coverage in the printing region corresponding to the overlapping region, and quantifying the variation in the dot coverage.

According to a fourteen aspect of the invention, in the method according to the thirteen aspect of the invention, it is preferable that the plurality of types of shifted patterns include a pattern in which no dot is shifted.

According to a fifteen aspect of the invention, in the method according to the thirteen aspect of the invention, it is preferable that the coverage evaluation value indicate the variation in the dot coverage calculated for the plurality of types of shifted patterns.

According to a sixteen aspect of the invention, it is preferable that the method according to the ninth aspect of the invention include storing, in a storage medium of the printing device, a program that causes the computer to achieve a function of correcting an irregularity in the density of a printed image, and a density difference correction table that is used for the correction, the irregularity being caused by the difference between the first and second main scanning that is continuously performed and being generated in the printing region corresponding to the overlapping region in a direction crossing a direction in which a raster extends.

In addition to the methods for generating a dither mask, the invention can be achieved as a printing device that stores the dither mask generated by any of the methods, a program that causes the computer to achieve a function of performing the halftone process using the dither mask generated by any of the methods, a program that is used to generate the dither mask, a storage medium that stores the programs, and the like.

BRIEF DESCRIPTION OF THE DRAWINGS

The invention will be described with reference to the accompanying drawings, wherein like numbers reference like elements.

FIG. 10 is a diagram showing a head group determination process in detail.

FIG. 15 is a flowchart of a process for calculating the first evaluation value.

FIGS. 16A to 16E are diagrams showing a method for calculating coverage that is used to calculate the first evaluation value.

FIG. 17 is a diagram showing blue noise characteristics and green noise characteristics.

FIGS. 19A to 19D are diagrams showing a method for using the dither mask in a halftone process.

FIGS. 20A to 20D are diagrams showing a method for using a dither mask according to a modified example in the halftone process.

FIG. 21 is a flowchart of a process for generating a dither mask according to another modified example.

FIG. 25 is a diagram showing the configuration of a printing head in detail.

FIGS. 26A to 26C are diagrams showing an effect of the invention.

DESCRIPTION OF EXEMPLARY EMBODIMENTS

A. Embodiment

Figure 1:
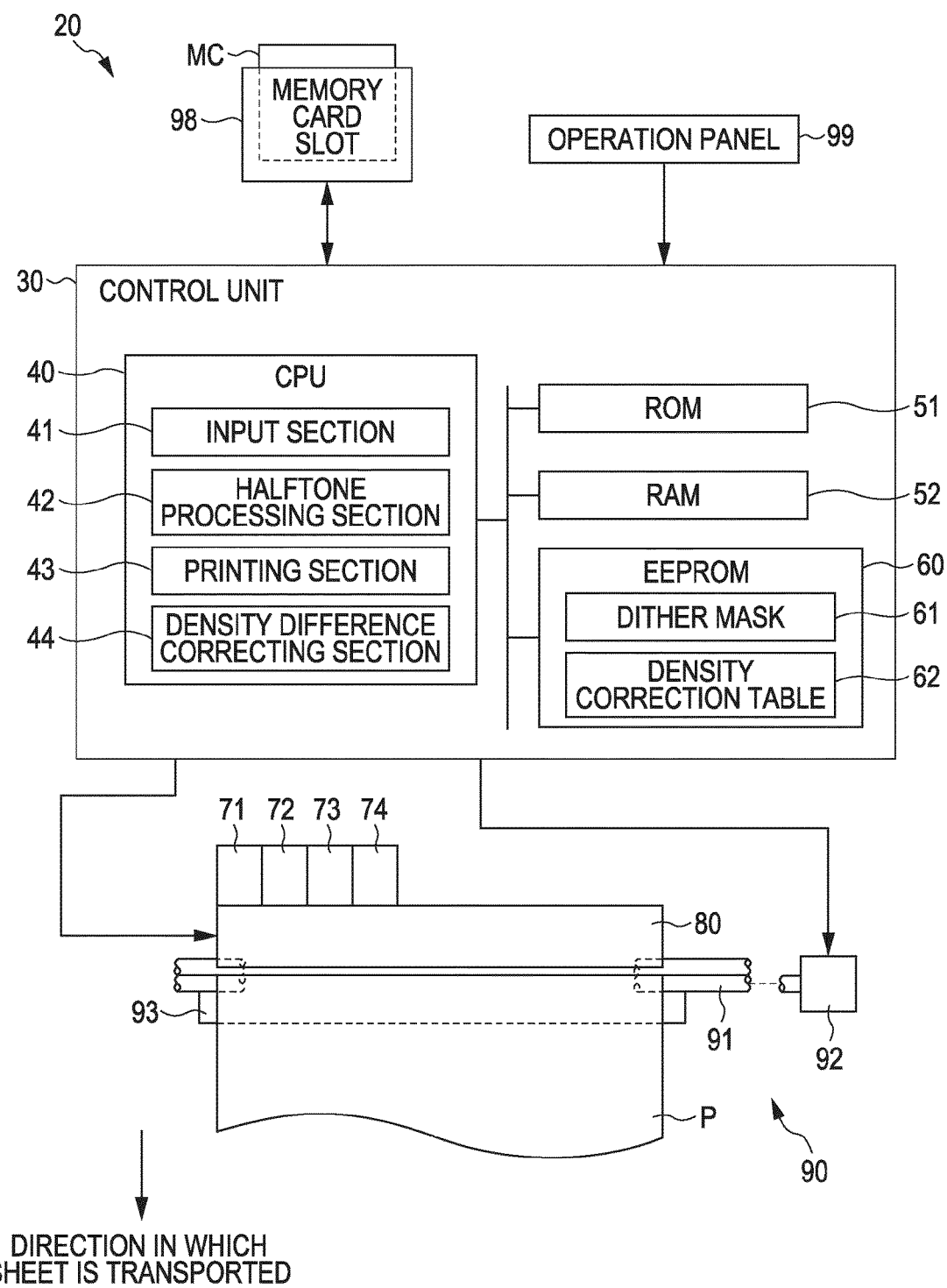
FIG. 1 is a diagram showing the outline configuration of a printer according to an embodiment of the invention.

An embodiment of the invention is described below.
A-1. Configuration of Printing Device FIG. 1 is a diagram showing the outline configuration of a printer 20 according to the present embodiment. The printer 20 is an ink jet line printer. As shown in FIG. 1, the printer 20 includes a control unit 30, ink cartridges 71 to 74, printing heads 80, and a sheet feeding mechanism 90. The ink cartridges 71 to 74 correspond to cyan (C) ink, magenta (M) ink, yellow (Y) ink and black (K) ink. The types of ink and the number of ink cartridges are not limited to the aforementioned ink and the aforementioned ink cartridges. For example, the printer 20 may use only black ink or use light ink (such as light cyan (Lc) ink and light magenta (Lm)) ink and special color ink (such as blue (B) ink and red (R) ink).

The printing heads 80 are of a line head type and each include a plurality of arrays of thermal-type nozzles arranged in approximately a single row on a lower surface of the printing head 80. The ink that is included in the ink cartridges 71 to 74 is supplied through introduction tubes (not shown) to the nozzles that are provided in each of the printing heads 80 and eject ink from the lower surface of the printing head 80. The ink is ejected from the nozzles so that printing is performed on a printing sheet P. The printing heads 80 are described later in detail with reference to FIG. 2.

The sheet feeding mechanism 90 includes a sheet feeding roller 91, a sheet feeding motor 92 and a platen 93. The sheet feeding motor 92 rotates the sheet feeding roller 91 so that the printing sheet P that is placed between the printing heads 80 and the flat plate-like platen 93 is transported in a direction perpendicular to the direction of an axis of the sheet feeding roller 91.

The control unit 30 includes a CPU 40, a ROM 51, a RAM 52 and an EEPROM 60 that are connected to each other through a bus. The CPU 40 controls an entire operation of the printer 20 by implementing programs stored in the ROM 51 and the EEPROM 60 in the RAM 52 and executing the programs. The CPU 40 also functions as an input section 41, a halftone processing section 42, a printing section 43 and a density difference correcting section 44. These functional sections are described later in detail.

A dither mask 61 and a density correction table 62 are stored in the EEPROM 60. The dither mask 61 is used in a halftone process (that is performed using an ordered dither method) and includes a plurality of thresholds. The dither mask 61 according to the present embodiment has predetermined characteristics that depend on a method for generating the dither mask 61. The characteristics of the dither mask 61 and the method for generating the dither mask 61 are described later. The density correction table 62 is used to correct input gradation values in order to suppress an irregularity in the density of a printed image. In the density correction table 62, the input gradation values before the correction are associated with the corrected gradation values.

The control unit 30 is connected to a memory card slot 98. The control unit 30 can read image data from a memory card MC inserted in the memory card slot 98 and receive the read image data. In the present embodiment, the image data received from the memory card MC is constituted by three color components: a red (R) component; a green (G) component; and a blue (B) component. In addition, the control unit 30 is connected to an operation panel 99. A user can operate the printer 20 using the operation panel 99.

A-2. Detailed Configurations of Printing Heads

Figure 2:
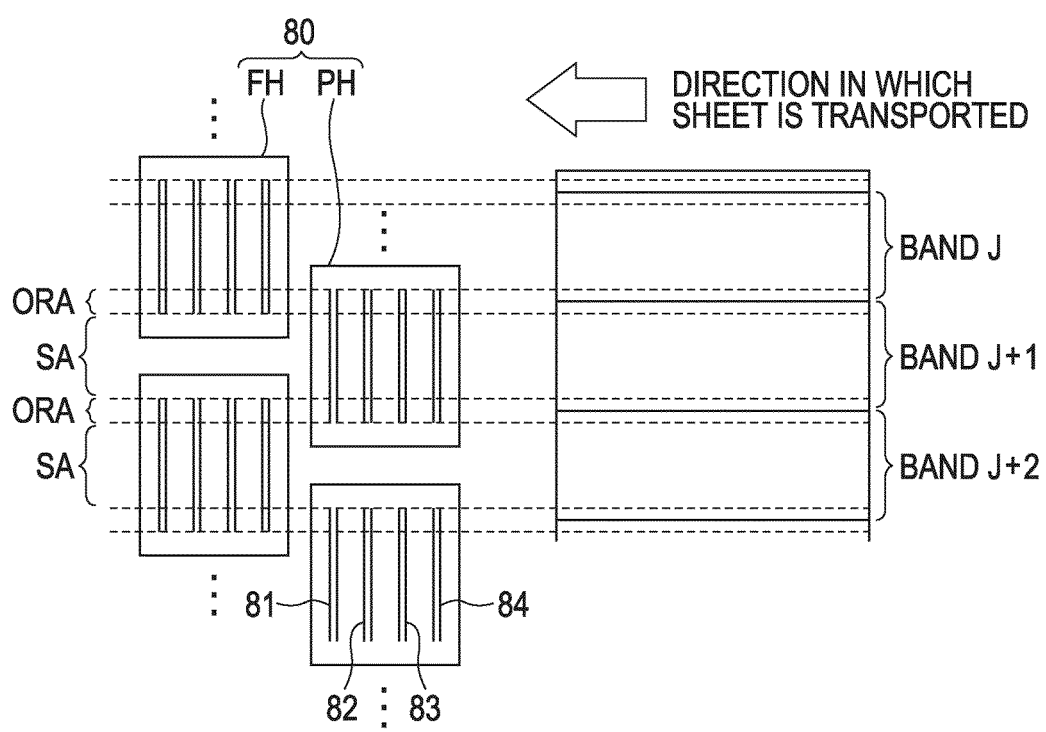
FIG. 2 is a diagram showing the configurations of printing heads in detail.

FIG. 2 is a diagram showing the configurations of the printing heads 80 in detail. As shown in FIG. 2, the printing heads 80 according to the present embodiment each include nozzle arrays 81 to 84 that eject cyan, magenta, yellow and black ink, respectively. The printing heads 80 are arranged in a zigzag pattern in a region that corresponds to a printing region of the printing sheet P. The reason that the printing heads 80 are arranged in a zigzag pattern is to solve a problem with the strength of end portions of the printing heads and a problem with a space in which additional elements of the printing heads are installed. The number of printing heads may be two or more. In addition, the arrangement of the printing heads is not limited. For example, the printing heads may be arranged in a step-like pattern or the like. In the present embodiment, the nozzles that form each of the nozzle arrays 81 to 84 are arranged in a straight row in a direction in which the printing heads are arranged. However, the arrangement of the nozzles is not limited. For example, the nozzles that are included in each of the printing heads may be arranged in a zigzag pattern.

Among the printing heads, a printing head that is arranged on the side from which the printing sheet P is transported is also called a preceding head PH, while a printing head that is arranged on the side toward which the printing sheet P is transported is also called a following head FH. End portions (hereinafter referred to as overlapping regions ORA) of the preceding and following heads PH and FH overlap each other in the direction in which the printing heads are arranged. In addition, the preceding head PH has a portion (hereinafter referred to as a non-overlapping region SA) that does not overlap the following head FH in the direction in which the printing heads are arranged, while the following head FH has a portion (hereinafter referred to as a non-overlapping region SA) that does not overlap the preceding head PH in the direction in which the printing heads are arranged. The reason that the overlapping regions ORA are provided is to suppress the occurrence of banding (caused by differences between characteristics of the printing heads or the like) in a printed image portion that corresponds to overlapping regions of the printing heads.

The preceding head PH and the following head FH adjust the timing for feeding the sheet and the timing for ejecting ink and form a single dot line that extends in the direction in which the printing heads are arranged. In a printing region that corresponds to the non-overlapping region SA of the preceding head PH, the preceding head PH form dots. In a printing region that corresponds to the non-overlapping region SA of the following head FH, the following head PH form dots. In a printing region that corresponds to the overlapping regions ORA, both the preceding heads PH and the following heads FH form dots. Either the preceding head PH or the following head FH forms a dot at each of appropriate positions in the printing region that correspond to the overlapping regions ORA.

The operation for forming a dot line that extends in the direction in which the printing heads are arranged is continuously performed so that dot lines (also called rasters in the present embodiment) are formed and extend in the direction in which the printing sheet P is transported. Regions that are included in the printing region (in which dots are formed in the aforementioned manner) and correspond to the printing heads are called bands. In the present embodiment, the printing region that corresponds to the overlapping regions ORA is divided along a center line of the printing region corresponding to the overlapping regions ORA for convenience as shown in FIG. 2. In addition, numbers are added to the bands to distinguish each of the bands from the others (J shown in FIG. 2 is a positive integer).

A-3. Printing Process

Figure 3:
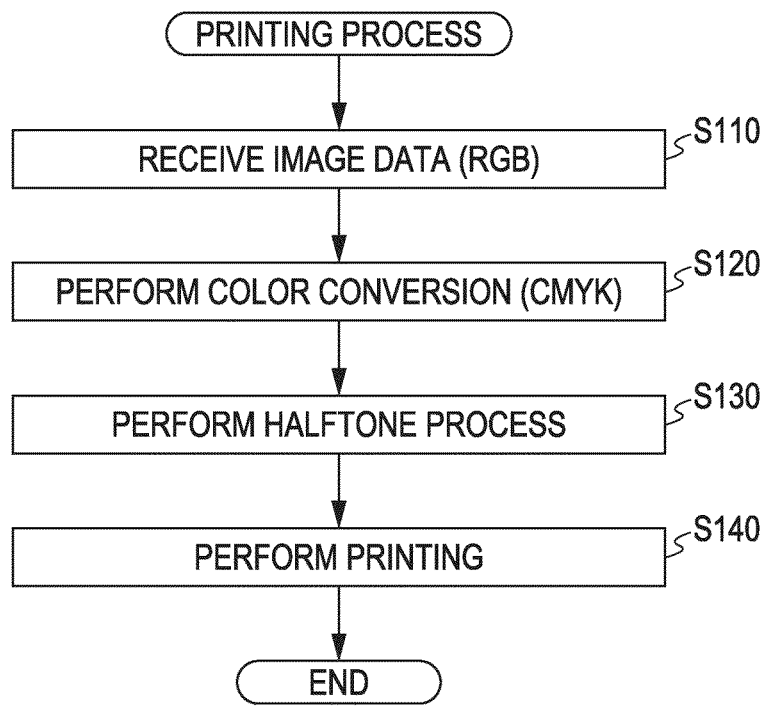
FIG. 3 is a flowchart of a printing process that is performed by the printer.

A printing process that is performed by the printer 20 is described below. FIG. 3 is a flowchart of the printing process that is performed by the printer 20. When the user operates the operation panel 99 or the like to instruct the printer 20 to print a predetermined image stored in the memory card MC, the printing process is started by the user operation. When the printing process starts, the CPU 40 reads RGB image data (to be printed) from the memory card MC through the memory card slot 98 and receives the image data as processing of the input section 41 (in step S110).

When the CPU 40 receives the image data, the CPU 40 references a lookup table (not shown) stored in the EEPROM 60 and performs color conversion to convert the RGB image data into CMYK image data (in step S120).

After the color conversion is performed, the CPU 40 performs the halftone process to convert the image data into dot ON/OFF data for each of the colors as processing of the halftone processing section 42 (in step S130). In the halftone process (according to the present embodiment) using the ordered dither method, the dither mask 61 is used so that the input data is compared with each of the thresholds of the dither mask 61. When the input data is equal to or larger than the threshold, the CPU 40 determines that a dot is set to an ON state (or determines that the dot is to be formed). When the input data is smaller than the threshold, the CPU 40 determines that the dot is set to an OFF state (or determines that the dot is not to be formed). The halftone process is not limited to the binary processing for setting a dot to the ON or OFF state. The halftone process may be performed on data of multiple values. For example, the halftone process may be performed to set large and small dots to ON and OFF states (or to determine whether or not the large and small dots are to be formed). The image data may be subjected to image processing such as solution conversion processing and smoothing processing before step S130 is performed.

In the present embodiment, the CPU 40 performs the halftone process on the input data that has been subjected to density difference correction processing. The density difference correction processing is a known technique (for example, refer to JP-A-2005-224976). The technique is not described in detail. When dots that are formed on a printing sheet are shifted from target positions on a nozzle basis or on a raster basis due to a variation (caused by a problem with the accuracy of processing the printing heads and the nozzles) in the orientations or intervals of the nozzles, the difference between dot densities, which is caused by the shifting of the dots, may be visible as an irregularity in the density of a printed image. In the density difference correction processing, the color of the irregular portion is premeasured, and the input gradation values that are to be subjected to the halftone process are corrected so that the irregularity in the density can be reduced. In the present embodiment, the CPU 40 executes the density difference correction processing as processing of the density difference correcting section 44 while referencing the density correction table 62.

After the halftone process is performed, the CPU 40 drives the printing heads 80, the sheet feeding motor 92 and the like on the basis of the results of the halftone process and performs printing as processing of the printing section 43 (in step S140). Then, the printing process is terminated.

A-4. Method for Generating Dither Mask 61

Figure 4:
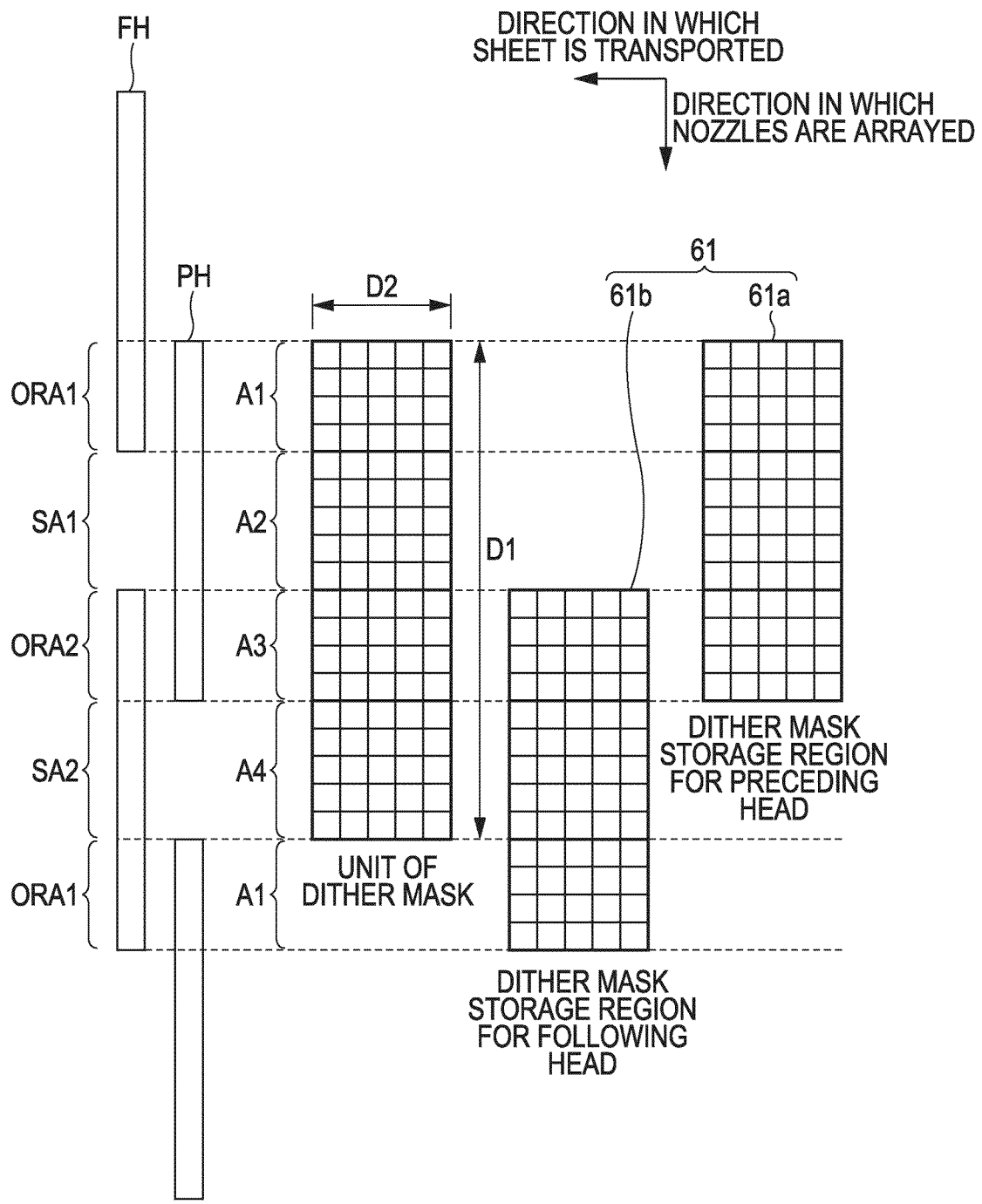
FIG. 4 is a diagram showing the size of a dither mask.

The method for generating the dither mask 61 is described. First, the size and configuration of the dither mask 61 to be generated are described. The preceding and following heads PH and FH, which are the printing heads 80, are arranged in a zigzag pattern. In other words, the preceding head PH and the following head FH are repeatedly arranged at constant intervals. The positional relationships between the preceding heads PH and the following heads FH arranged in the direction (hereinafter referred to as a nozzle array direction) in which the nozzles are arrayed are shown in FIG. 4. Specifically, a lower end portion of the following head FH and an upper end portion of the preceding head PH overlap each other in the nozzle array direction and are called overlapping regions ORA1. Only a portion of the preceding head PH exists in the nozzle array direction and is called a non-overlapping region SA1. An upper end portion of the following head FH and a lower end portion of the preceding head PH overlap each other in the nozzle array direction and are called overlapping regions ORA2. Only a portion of the following head FH exists in the nozzle array direction and is called a non-overlapping region SA2. Thus, the overlapping region ORA1, the non-overlapping region SA1, the overlapping region ORA2 and the non-overlapping region SA2 are repeatedly arranged in the nozzle array direction.

The size D1 of the dither mask 61 to be generated, which is measured in a longitudinal direction (nozzle array direction) of the dither mask 61, is preferably set to a value that corresponds to the number (corresponding to an integral multiple of a cycle of the repeated arrangement) of pixels. In the present embodiment, the size D1 of the dither mask 61 corresponds to one cycle of the repeated arrangement (repeated pattern). For example, when the number of nozzles that form a single nozzle array included in each of the preceding and following heads PH and FH is 360 and the number of nozzles included in each of the overlapping regions ORA1 and ORA2 is 8, the size D1 corresponds to 704 pixels ($=8+(360-8\times2)+8+(360-8\times2)$).

When the size D1 of the dither mask 61 is set in the aforementioned manner and the single dither mask 61 is repeatedly arranged in the longitudinal direction, the relationship between the position of each of the nozzles arranged in the repeated pattern and each of the thresholds (each of which is used to determine whether or not a dot is to be formed) of the dither mask 61 can be maintained constant. As a result, a desired halftone process can be efficiently performed on the basis of characteristics of the dither mask 61 generated by the method (described later). The size D1 is not limited to the integral multiple of the cycle of the repeated pattern. For example, when two dither masks are alternately used, the size D1 of each of the dither masks 61 may be a half of the cycle of the repeated pattern.

The size D2 of the dither mask 61 in a lateral direction (direction in which the sheet is transported) of the dither mask 61 is set to a value that is in a range so that when the dither mask 61 is repeatedly arranged in the lateral direction and the halftone process is performed using the repeated arranged dither mask 61, the cycle of the repeated arranged dither mask 61 is not visible. For example, the size D2 is preferably set to approximately 256 pixels.

In the following description, it is assumed that the size D1 of the dither mask 61 in the longitudinal direction is 18 pixels and the size D2 of the dither mask 61 in the lateral direction is 5 pixels in order to simplify the description. Thus, the dither mask 61 is used for image data of 90 ($=18\times5$) pixels (except as otherwise described). The dither mask 61 has storage elements that correspond to the size of the dither mask 61. The storage elements store the thresholds that constitute the dither mask 61. The dither mask 61 is formed by storing the thresholds in all the storage elements.

As shown in FIG. 4, the dither mask 61 has a preceding head storage region 61a and a following head storage region 61b. The preceding head storage region 61a includes storage elements and has a region that corresponds to pixels corresponding to dots that can be simultaneously formed by the preceding head PH. The following head storage region 61b includes storage elements and has a region that corresponds to pixels corresponding to dots that can be simultaneously formed by the following head FH. In the halftone process according to the present embodiment, the CPU 40 determines, using the thresholds stored in the preceding head storage region 61a, whether or not dots are to be formed by the preceding head PH, and determines, using the thresholds stored in the following head storage region 61b, whether or not dots are to be formed by the following head FH. Among the storage elements, an area in which thresholds that are to be used for the overlapping region ORA1 are stored, an area in which thresholds that are to be used for the non-overlapping region SA1 are stored, an area in which thresholds that are to be used for the overlapping region ORA2 are stored, and an area in which thresholds that are to be used for the non-overlapping region SA2 are stored, are also called segmented areas A1, A2, A3 and A4, respectively.

Figure 5:
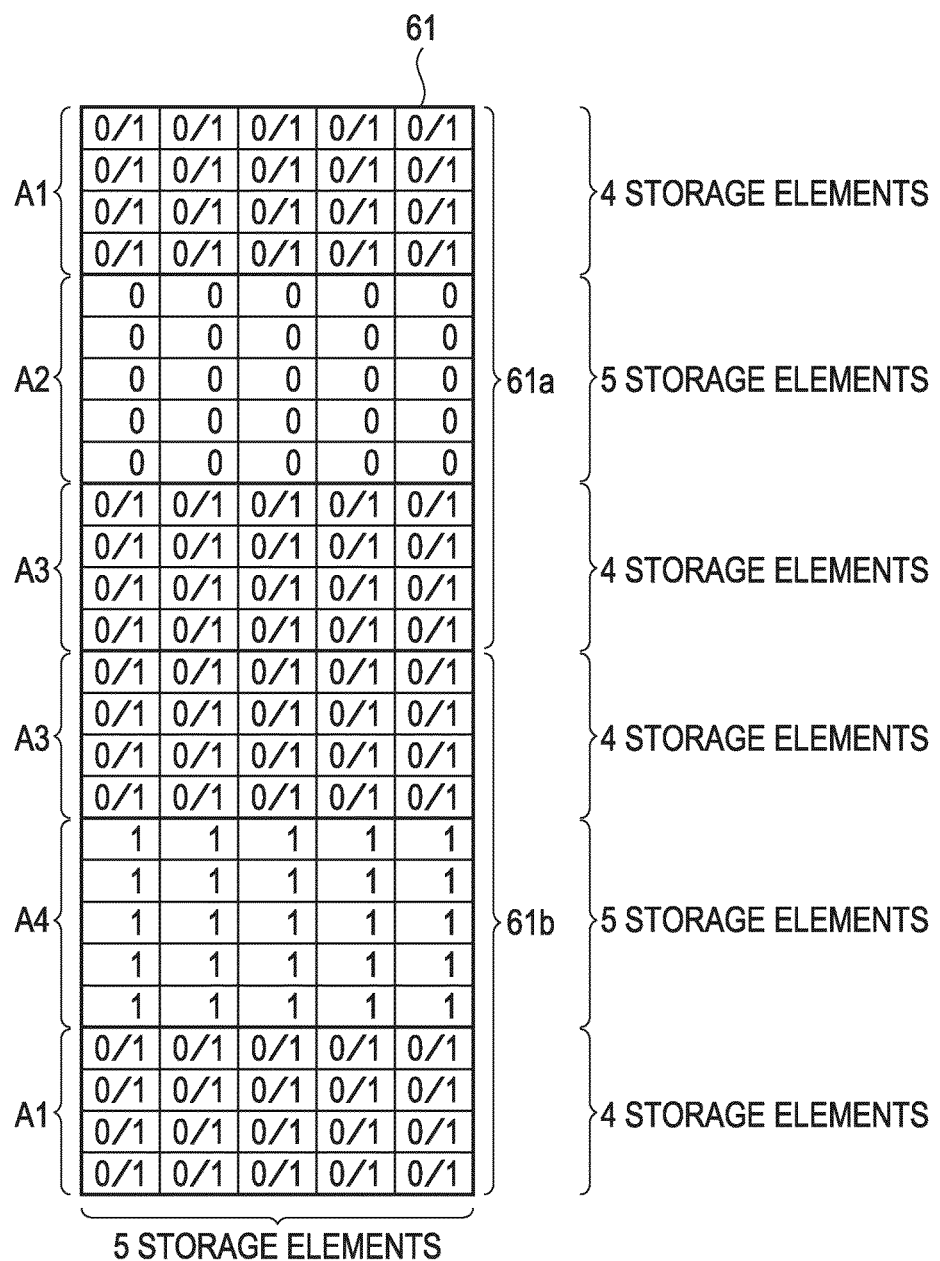
FIG. 5 is a diagram showing regions of storage elements that store thresholds of the dither mask.

FIG. 5 shows the segmented areas A1 to A4 in detail. Cells shown in FIG. 5 indicate the storage elements, respectively. As shown in FIG. 5, the preceding head storage region 61a includes the segmented area A1 (constituted by 4×5 storage elements and corresponding to the overlapping region ORA1), the segmented area A2 (constituted by 5×5 storage elements and corresponding to the non-overlapping region SA1) and the segmented area A3 (constituted by 4×5 storage elements and corresponding to the overlapping region ORA2). In FIG. 5, "0" indicates a region that stores a threshold that is used for image data on a dot to be formed by the preceding head PH; and "1" indicates a region that stores a threshold that is used for image data on a dot to be formed by the following head FH. In addition, "0/1" indicates a region that stores a threshold that is used for image data on a dot to be formed by the preceding or following head PH or FH depending on the method (described later) for generating the dither mask 61.

In a similar manner, the following head storage region 61b includes the segmented area A3 (constituted by 4×5 storage elements and corresponding to the overlapping region ORA2), the segmented area A4 (constituted by 5×5 storage elements and corresponding to the non-overlapping region SA2) and the segmented area A1 (constituted by 4×5 storage elements and corresponding to the overlapping region ORA1).

The dither mask 61 according to the present embodiment is used for image data of 90 pixels and has the preceding head storage region 61a and the following head storage region 61b. The preceding head storage region 61a has the segmented area A1 and the segmented area A3, while the following head storage region 61b has the segmented area A1 and the segmented area A3. Thus, the dither mask 61 has the 130 (=(4+5+4+4+5+4)×5) storage elements.

Figure 6:
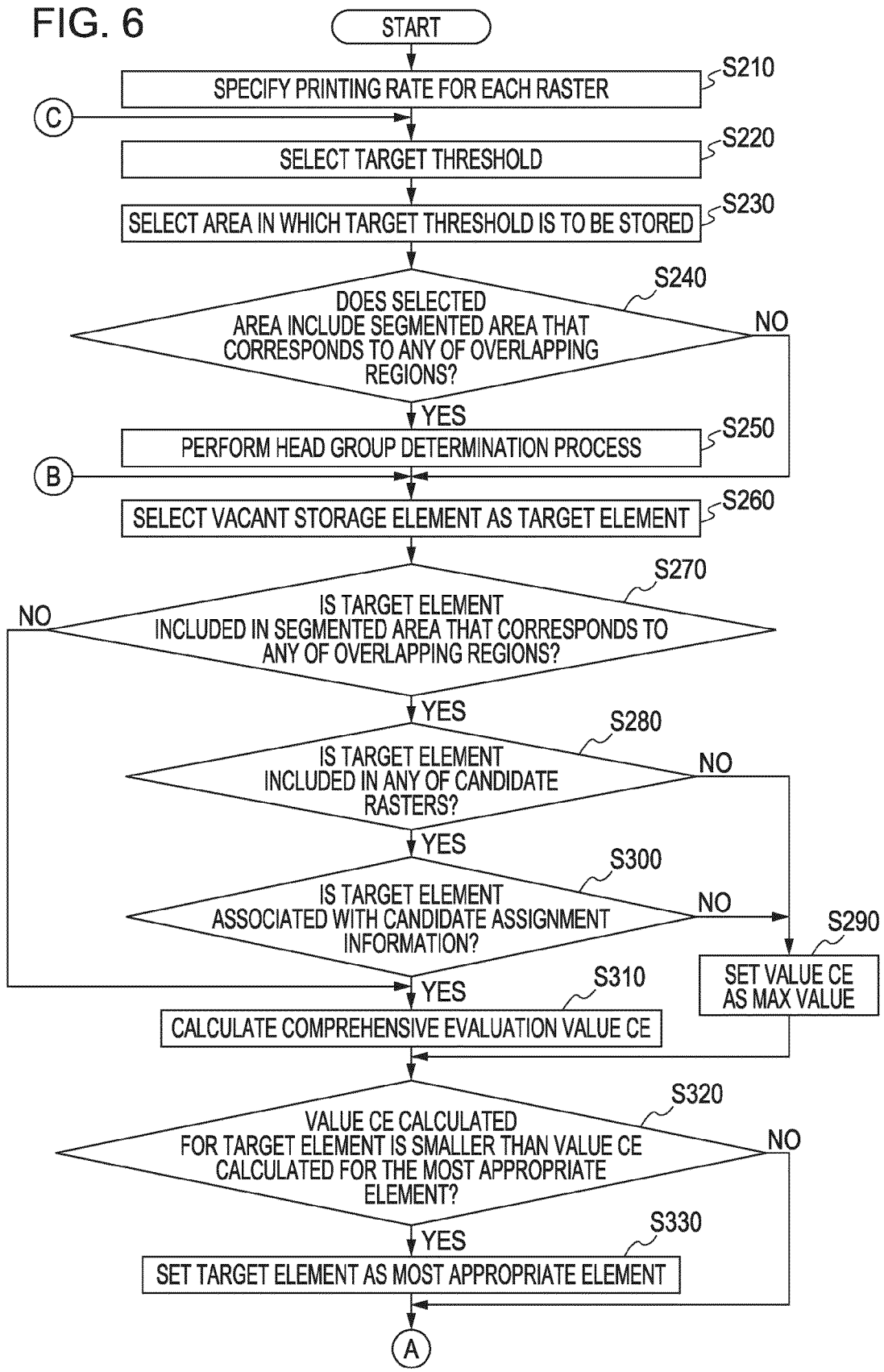
FIG. 6 is a flowchart of a process for generating the dither mask.
Figure 7:
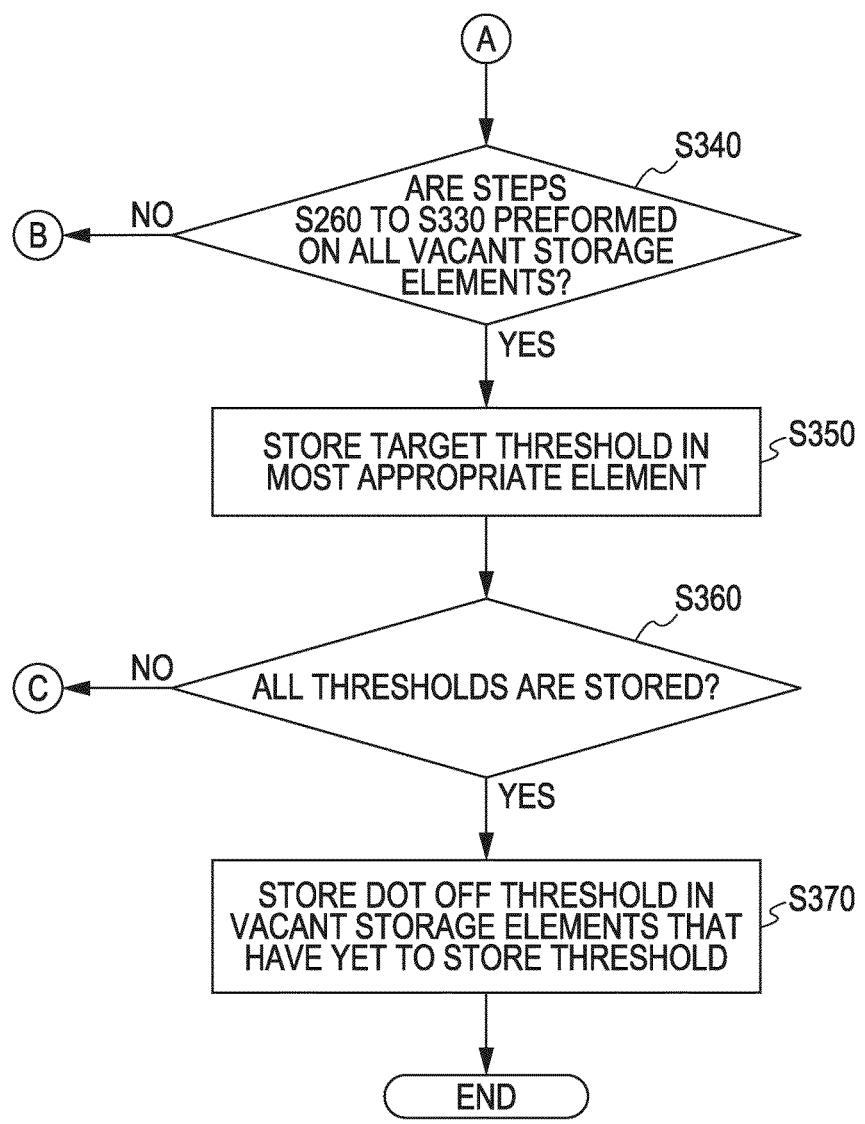
FIG. 7 is a flowchart of a process for generating the dither mask.

The method for generating the dither mask 61 that has the aforementioned size is described below. FIGS. 6 and 7 show flowcharts of a process of generating the dither mask 61. The method (described below) for generating the dither mask 61 is the process (of generating the dither mask 61 and the like) that is performed by a CPU that is included in a mainframe or the like. The whole or a part of the process described below may be performed by user operations. Although the dither mask 61 according to the present embodiment has the 130 storage elements, the dither mask 61 is used for image data of 90 pixels. In the following description, it is assumed that 90 thresholds of values 0 to 89 are prepared and the 130 storage elements store any of the thresholds so that the dither mask 61 is generated.

In the method for generating the dither mask 61, a rate (printing rate) of printing dots in regions that correspond to the overlapping regions ORA1 and ORA2 is first specified for each of rasters (dot lines that extend in the direction in which the printing sheet P is transported) (in step S210). The printing rate that is specified for each of rasters is the ratio of the number of dots that form a part of the raster and are to be formed by the preceding head PH in the region that corresponds to each of the overlapping regions ORA1 and ORA2 of the preceding head PH to the number of dots that form the other part of the raster and are to be formed by the following head FH in the region that corresponds to each of the overlapping regions ORA2 and ORA1 of the following head FH. In other words, the printing rate indicates a dot formation rate (ratio of the number of dots to be formed by the preceding head PH to the number of dots to be formed by the following head FH) of the preceding head PH for each of the rasters and a dot formation rate (ratio of the number of dots to be formed by the following head FH to the number of dots to be formed by the preceding head PH) of the following head FH for each of the rasters.

Figures 8, 9:
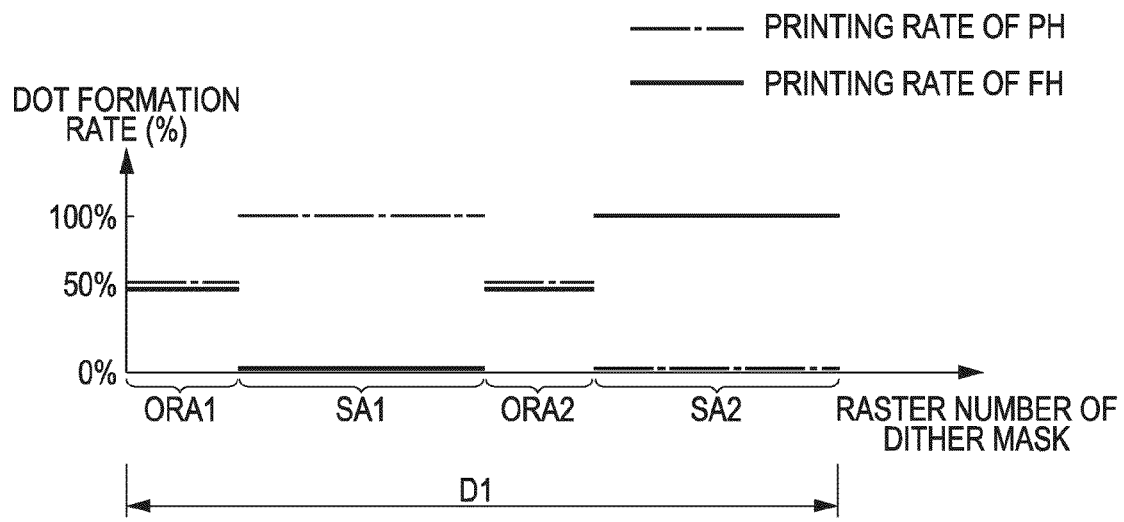
FIG. 8 is a diagram showing an example of printing rates.
FIG. 9 is a diagram showing a method for determining a segmented area in which a target threshold is to be stored.

The printing rates according to the present embodiment are shown in FIG. 8. The abscissa of FIG. 8 indicates a raster number that corresponds to the size D1 of the dither mask 61 in the longitudinal direction. The ordinate of FIG. 8 indicates the dot formation rate of the preceding head PH and the dot formation rate of the following head FH. As shown in FIG. 8, in the present embodiment, the printing rate is set to 50% for each of all the rasters to be formed in the regions that correspond to the overlapping regions ORA1 and ORA2 of the preceding and following heads PH and FH. For a raster to be formed in a region that corresponds to the non-overlapping region SA1, the dot formation rate of the preceding head PH is set to 100%, since only the non-overlapping region SA1 of the preceding head PH exists. For a raster to be formed in a region that corresponds to the non-overlapping region SA2, the dot formation rate of the following head FH is set to 100%, since only the non-overlapping region SA2 of the following head FH exists. The printing rate is not limited to the aforementioned ratio and may be set to a desired rate that is specified by the manufacturer.

After the printing rate is specified, a target threshold is selected (in step S220). In this case, the target threshold is selected from among thresholds of 0 to 89 that are yet to be stored in the storage elements. In the present embodiment, the target thresholds are sequentially selected in order from the lowest threshold. For example, when the thresholds of 0 to 7 have already been stored in storage elements in steps described later, the target threshold that is selected in step S220 is the threshold of 8.

After the target threshold is selected, a segmented area selecting process is performed so that a segmented area in which the selected target threshold is to be stored is selected from the segmented areas A1 to A4 (in step S230). The segmented area selecting process is performed to select a candidate for a segmented area that includes a storage element in which the selected target threshold is to be stored. The number of segmented areas to be selected in step S230 may be one or more. The segmented area selecting process is described below with reference to FIG. 9. In an example shown in FIG. 9, the segmented areas A1 and A3 each include 20 storage elements, while the segmented areas A2 and A4 each include 25 storage elements. In the example shown in FIG. 9, the segmented area A1 includes the segmented area A1 of the preceding head storage region 61a and the segmented area A1 of the following head storage region 61b, while the segmented area A3 includes the segmented area A3 of the preceding head storage region 61a and the segmented area A3 of the following head storage region 61b. In the following description, it is assumed that the numbers of thresholds stored in the segmented areas A1, A2, A3 and A4 are 3, 6, 4 and 6, respectively.

Step 230 is performed as follows. First, the ratio (hereinafter also referred to as the threshold setting ratio) of the number of thresholds stored in storage elements of each of the segmented areas A1 to A4 to the number of all storage elements included in the segmented area is calculated by the following Equation 1. For example, the ratio of the number of thresholds stored in storage elements of the segmented area A1 to the number of all the storage elements included in the segmented area A1 is 15% (=3/20).

Threshold setting ratio (%)=(the number of thresholds stored in storage elements of segmented area)/ (the number of all storage elements of segmented area) (Equation 1)

Next, the minimum threshold setting ratio is specified. In the example shown in FIG. 9, the ratio of the thresholds stored in the storage elements of the segmented area A1 to the number of all the storage elements of the segmented area A1 is 15% and minimal. Then, a segmented area of which the threshold setting ratio is in a predetermined range from the minimum threshold setting ratio to a value obtained by adding a predetermined acceptable value to the minimum threshold setting ratio is selected. In the present embodiment, the predetermined acceptable value is 5. In this case, the segmented areas A1 and A3 are selected.

Specifically, in step S230, when the target threshold is stored in a storage element (hereinafter also referred to as a vacant storage element) that has yet to store a threshold, a segmented area is selected as a candidate for an area in which the target threshold is to be stored so that the ratio of the number of storage elements (hereinafter also referred to as threshold-stored storage elements) that have thresholds stored therein and are included in each of the segmented areas to the number of all storage elements included in the segmented area is in a predetermined range from a value, set so that the ratios are equal to each other, to a predetermined value.

After the segmented area is selected, it is determined whether or not the selected segmented area includes the segmented area A1 or A3 that corresponds to the overlapping region ORA1 or ORA2 (in step S240). When the selected segmented area includes the segmented area A1 or A3 (or when the answer is YES in step S240), a head group determination process is performed (in step S250). In the head group determination process, candidates for a vacant storage element in which the target threshold is to be stored, which correspond to the overlapping regions ORA, are narrowed down on the basis of the balance of a dot arrangement. Specifically, in the segmented area A1 or A3 that includes the target element, the rasters are narrowed down to determine any of the rasters, which corresponds to a vacant storage element in which the target threshold is to be stored; and assignment information that indicates whether the preceding head PH or the following head FH forms a dot is narrowed down so that the preceding head PH or the following head FH forms a dot at an appropriate position for which the target threshold is used.

The head group determination process is described in detail with reference to FIG. 10. FIG. 10 shows the numbers of threshold-stored storage elements included in the segmented area A3 for each of rasters, and values ideal for the numbers of the threshold-stored storage elements. As described above, the size D2 of the dither mask 61 according to the present embodiment in the lateral direction corresponds to 5 pixels. In the example shown in FIG. 10, however, the size D2 of the dither mask 61 corresponds to 25 pixels in order to clarify the process, and the segmented area A3 includes 25 storage elements arranged in a direction in which each of the rasters extends.

The field (A) shown in FIG. 10 indicates a raster number that represents a row in which storage elements that correspond to the raster are arrayed in the segmented area A3 of each of the preceding and following heads PH and FH. In the description with reference to FIG. 10, each of the rows of the storage elements is also called a raster. A row in which storage elements are arrayed, which is indicated by the raster number 1, is also called a "raster 1". The rasters described with reference to FIG. 10 each include a raster of the preceding head storage region 61a and a raster of the following head storage region 61b. The field (B) shown in FIG. 10 indicates the number of threshold-stored storage elements for each of the rasters. As shown in FIG. 10, 21 thresholds, 22 thresholds, 20 thresholds and 22 thresholds are already stored in the rasters 1, 2, 3 and 4, respectively.

The field (B) shown in FIG. 10 indicates that each of the threshold-stored storage elements is included in either the segmented area A3 of the preceding head storage region 61a or the segmented area A3 of the following head storage region 61b. For example, for the raster 1, 10 of the 21 threshold-stored storage elements are included in the segmented area A3 of the following head storage region 61b, while 11 of the 21 threshold-stored storage elements are included in the segmented area A3 of the preceding head storage region 61b. This means that information that indicates positions (at which dots are to be formed) for which the thresholds stored in the 10 storage elements are used is assigned to the following head FH so that the following head FH forms dots at the positions, while information that indicates positions (at which dots are to be formed) for which the thresholds stored in the 11 storage elements are used is assigned to the preceding head PH so that the preceding head FH forms dots at the positions.

The left side of the field (D) shown in FIG. 10 indicates the ratio (hereinafter also referred to as the threshold storage rate) (finally determined on the basis of the printing rate specified in step S210) of the number of storage elements that have thresholds stored therein and correspond to the following head FH to the number of storage elements that have thresholds stored therein and correspond to the preceding and following heads PH and FH for each of the rasters. The right side of the field (D) shown in FIG. 10 indicates the ratio (hereinafter also referred to as the threshold storage rate) (finally determined on the basis of the printing rate specified in step S210) of the number of storage elements that have thresholds stored therein and correspond to the preceding head PH to the number of storage elements that have thresholds stored therein and correspond to the preceding and following heads PH and FH for each of the rasters. In the example shown in FIG. 10, both threshold storage rates are 50%.

The field (C) shown in FIG. 10 indicates ideal numbers (hereinafter also referred to as ideal assignment values) of thresholds assigned to the preceding and following heads PH and FH. The ideal numbers shown in the field (C) are determined on the basis of an assumption that the target threshold is stored in each of the rasters. Each of the ideal assignment values can be calculated by multiplying the threshold storage rate by a value obtained by adding 1 (assuming that the target threshold is stored) to the number of the threshold-stored storage elements. For example, when the target threshold is stored in the raster 1, the ideal assignment values of the preceding and following heads PH and FH are 11 (=50%× (21+1).

In the head group determination process according to the present embodiment, an acceptable level of the ideal dot arrangement is set on the basis of the aforementioned information, and candidates for a combination of the assignment information and a raster in which the target threshold is to be stored are set on the basis of the aforementioned information. In other words, in the head group determination process, candidates for a raster that is included in the preceding head storage region 61a or the following head storage region 61b and in which the target threshold is to be stored are set.

Specifically, the rasters are narrowed down so that when it is assumed that the target threshold is stored in each of the rasters, the number of threshold-stored storage elements included in each of the rasters is in a predetermined range from a value, set so that the numbers are equal to each other, to a predetermined value. In the present embodiment, the rasters are narrowed down so that the difference between the number of threshold-stored storage elements of a raster that includes the smallest number of threshold-stored storage elements and the number of threshold-stored storage elements of a raster that includes the largest number of threshold-stored storage elements is 2 or less.

In the example shown in FIG. 10, when the target threshold is stored in the raster 1, the number of threshold-stored storage elements of the raster 1 is 22 (=21+1). In this case, the aforementioned difference is 2 and in the predetermined range. When the target threshold is stored in the raster 3, the number of threshold-stored storage elements of the raster 3 is 21. In this case, the aforementioned difference is 1 and in the predetermined range. On the other hand, when the target threshold is stored in the raster 2 or 4, the number of threshold-stored storage elements of the raster is 23. The aforementioned difference is 3 and is not in the predetermined range. Thus, the rasters are narrowed down to the rasters 1 and 3 in which the target threshold is to be stored so that the rasters 1 and 3 are selected. The rasters that are selected in this manner are also called candidate rasters.

The assignment information is narrowed down so that when it is assumed that the target threshold is stored in each of the rasters 1 and 3 that have been selected and a storage element in which the target threshold is to be stored is assigned to either the preceding head PH and the following head FH, the numbers of threshold-stored storage elements of the rasters 1 and 3 are in a predetermined range from the ideal assignment values to a predetermined value. In the present embodiment, the assignment information is narrowed down so that differences between the ideal numbers (ideal assignment values) of storage elements assigned to the preceding and following heads PH and FH and the numbers of storage elements that have thresholds stored therein and are actually assigned to the preceding and following heads PH and FH are 2 or less.

In the example shown in FIG. 10, when the target threshold is stored in the raster 1 and a storage element in which the target threshold is stored is assigned to the following head FH, the number of storage elements that have thresholds stored therein and are assigned to the preceding head PH is 11 and matches the ideal assignment value that is 11, and the number of storage elements that have thresholds stored therein and are assigned to the following head FH is 11 and matches the ideal assignment value that is 11. In this case, differences between the ideal assignment values (11, 11) and the numbers (11, 11) of the storage elements that have the thresholds therein and are assigned to the preceding and following heads PH and FH are 0. On the other hand, when the target threshold is stored in the raster 1 and a storage element in which the target threshold is stored is assigned to the preceding head PH, the number of storage elements that have thresholds stored therein and are assigned to the preceding head PH is 12, and the number of storage elements that have thresholds stored therein and are assigned to the following head FH is 10. In this case, differences between the ideal assignment values (11, 11) and the numbers (10, 12) of the storage elements that have the thresholds stored therein and are assigned to the following and preceding heads FH and PH are 1.

When the target threshold is stored in the raster 3 and a storage element in which the target threshold is stored is assigned to the following head FH, the number of storage elements that have thresholds therein and are assigned to the preceding head PH is 9, and the number of storage elements that have thresholds therein and are assigned to the following head FH is 12. In this case, differences between the ideal assignment values (10.5, 10.5) and the numbers (9, 12) of the storage elements that have the thresholds therein and are assigned to the preceding and following heads PH and FH are 1.5. On the other hand, when the target threshold is stored in the raster 3 and a storage element in which the target threshold is stored is assigned to the preceding head PH, the number of storage elements that have thresholds therein and are assigned to the preceding head PH is 8, and the number of storage elements that have thresholds therein and are assigned to the following head FH is 13. In this case, differences between the ideal assignment values (10.5, 10.5) and the numbers (8, 13) of the storage elements that have the thresholds therein and are assigned to the preceding and following heads PH and FH are 2.5. Thus, the assignment information is narrowed down so that the preceding and following heads PH and FH are selected as the assignment information for the raster 1 and the following head FH is selected as the assignment information for the raster 3. The assignment information that is selected in this manner is also called candidate assignment information.

Figure 11:
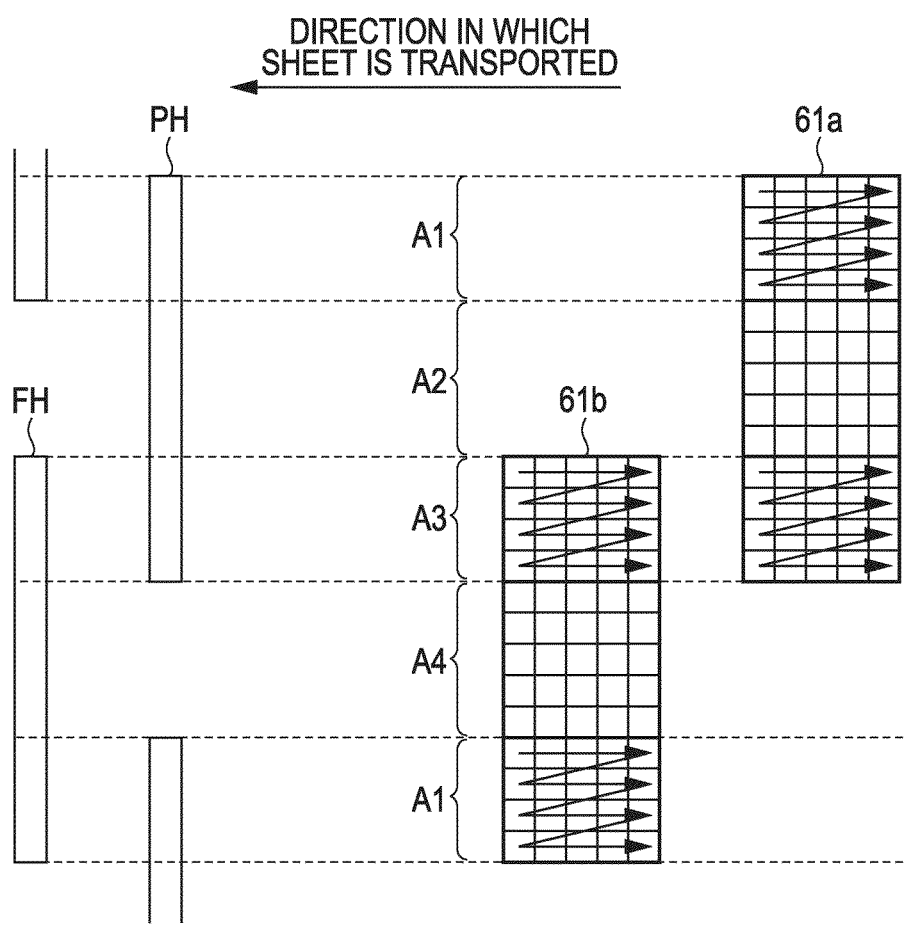
FIG. 11 is a diagram showing a method for selecting vacant storage elements that have yet to store a threshold.

After the head group determination process is performed so that the rasters and the assignment information are narrowed down, or when the selected segmented area does not include the segmented areas A1 and A3 (the answer is NO in step S240), one of vacant storage elements included in the selected segmented area is selected (in step S260). In step S260, the storage elements of the segmented areas (segmented areas A1 and A3 in this case) that have been selected in step S230 are sequentially scanned so that vacant storage elements are specified. As shown in FIG. 11, in the present embodiment, the scanning is performed from the storage element (of the segmented area A1) located on the upper left side of the segmented area A1. Then, the scanning is repeatedly performed so that vacant storage elements that have not been selected in step S260 (described later in detail) are sequentially selected. The vacant storage element selected in step S260 is also called a target element.

After the vacant storage element is selected as the target element, it is determined whether or not the target element is included in the segmented area A1 or A3 that corresponds to the overlapping region ORA1 or ORA2 (in step S270). When the target element is included in the segmented area A1 or A3 (or the answer is YES in step S270), it is determined whether or not the target element is included in any of the candidate rasters that have been selected in step S250 (in step S280).

When the target element is included in any of the candidate rasters (or the answer is YES in step S280), it is determined whether or not the target element is associated with the candidate assignment information that have been selected in step S250 (in step S300). Specifically, it is determined whether or not one of the preceding head storage region 61a and the following head storage region 61b, which includes the target element selected in step S260, matches the candidate assignment information in step S300. When the one of the preceding head storage region 61a and the following head storage region 61b matches the candidate assignment information, the target element is associated with the candidate assignment information. When the one of the preceding head storage region 61a and the following head storage region 61b does not match the candidate assignment information, the target element is not associated with the candidate assignment information.

When the target element is associated with the candidate assignment information (or the answer is YES in step S300) or is not included in the segmented area A1 or A3 (or the answer is NO in step S270), a comprehensive evaluation value CE is calculated for the target element selected in step S260 (in step S310). The comprehensive evaluation value CE is used to evaluate each of multiple candidates for a storage element in which the target threshold is to be stored. In addition, the comprehensive evaluation values CE are used to select, from among the candidates, a storage element in which the target threshold is to be stored. Whether the target threshold is stored in the preceding head storage region 61a or the following head storage region 61b is reflected in each of the comprehensive evaluation values CE. A method for calculating the comprehensive evaluation value CE is described later. In the present embodiment, the smaller the comprehensive evaluation value CE, the more excellent the target element as a storage element that stores the target threshold.

On the other hand, when the target element is not included in any of the candidate rasters (or the answer is NO in step S280) or is not associated with the candidate assignment information (or the answer is NO in step S300), the comprehensive evaluation value CE is set as a maximum value MAX (in step S290). The maximum value MAX is a preset value that is larger than the comprehensive evaluation value CE calculated in step S310 when the target element is included in any of the candidate rasters and associated with the candidate assignment information (or the answer is YES in step S300). The reason that the comprehensive evaluation value CE is set as the maximum value is to exclude the target element from candidates for a storage element in which the target threshold is to be stored when the target element is not included in any of the candidate rasters and associated with the candidate assignment information. This is due to the fact that it is not preferable to store the target threshold in the target element when the target element is not included in any of the candidate rasters and associated with the candidate assignment information.

When the comprehensive evaluation value CE is calculated or set in the aforementioned manner, the comprehensive evaluation value CE calculated for the target element is compared with a comprehensive evaluation value CE calculated for the most appropriate element (described later) (in step S320). When the comprehensive evaluation value CE calculated for the target element is smaller than the comprehensive evaluation value CE calculated for the most appropriate element (the answer is YES in step S320), the target element is set as the most appropriate element (in step S330). On the other hand, when the comprehensive evaluation value CE calculated for the target element is not smaller than the comprehensive evaluation value CE calculated for the most appropriate element, step S330 is omitted.

It is determined whether or not steps S260 to S330 are performed on all the vacant storage elements included in the segmented area selected in step S230 (in step S340). As is apparent from the above description, the most appropriate element is a vacant storage element for which a comprehensive evaluation value CE has been calculated and is smallest among comprehensive evaluation values CE that have been sequentially calculated for the vacant storage elements.

Figure 12B:
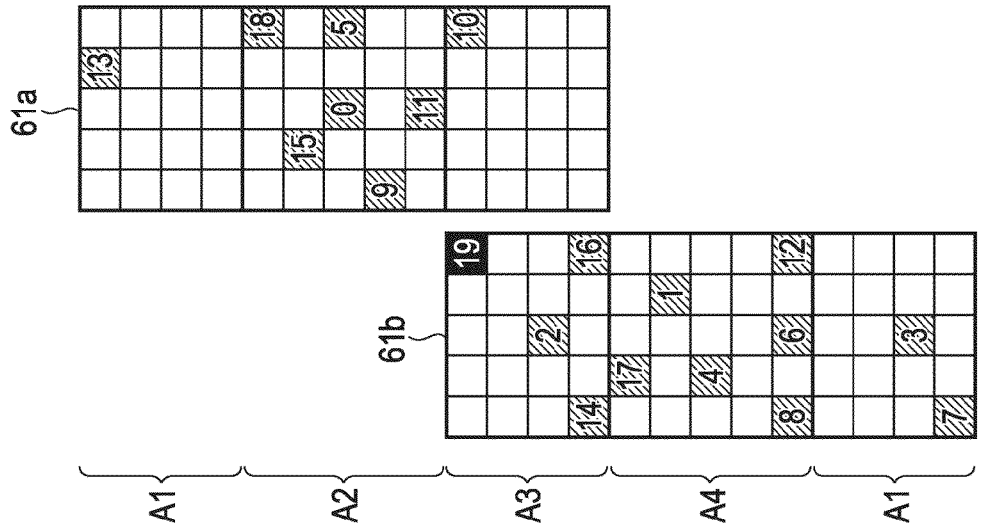
FIGS. 12A and 12B are diagrams showing a state in which the target threshold is stored in a storage element.
Figure 12A:
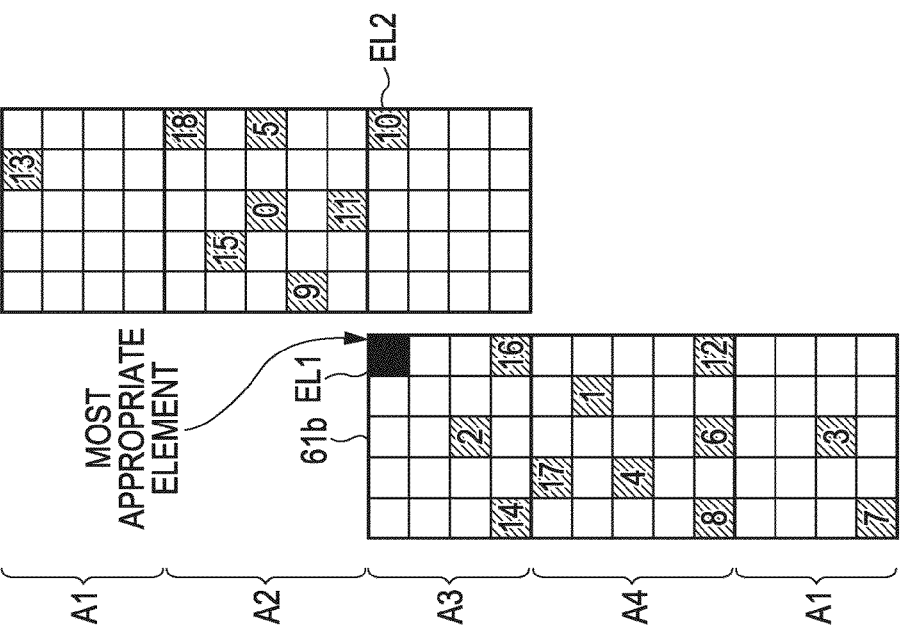

When the comprehensive evaluation values CE are calculated for all the vacant storage elements, the target threshold is stored in the most appropriate element (in step S350). An example of step S350 is shown in FIGS. 12A and 12B. FIG. 12A shows the state in which the thresholds of 0 to 18 have already been stored in storage elements and the most appropriate element has been determined. In FIGS. 12A and 12B, numbers represented in cells indicate the values of the stored thresholds. In this example shown in FIGS. 12A and 12B, a storage element EL1 that is included in the segmented area A3 of the following head storage region 61b is the most appropriate element. The threshold of 10 is stored in a storage element EL2 that corresponds to the same position (at which a dot is to be formed) as the position (at which the dot is to be formed) to which the storage element EL1 corresponds. In this case, a target threshold of 19 is stored in the storage element EL 1 that is the most appropriate element in step S350 as shown in FIG. 12B. The thresholds shown in FIGS. 12A and 12B are randomly arranged in order to explain the most appropriate element, and the arrangement (of the thresholds) shown in FIGS. 12A and 12B is not optimized by the aforementioned method. The arrangement of thresholds, which is shown in FIGS. 13A and 13B, is also not optimized.

As is apparent from the above description, in the present embodiment, thresholds are permitted to be stored in storage elements that are included in the preceding and following head storage regions 61a and 61b, respectively, and correspond to the same position at which a dot is to be formed. In the halftone process according to the present embodiment, it is determined using thresholds stored in the preceding or following head storage region 61a or 61b whether or not dots are to be formed by the preceding head and the following head. In the aforementioned method for storing thresholds, dots that are formed by the preceding and following heads PH and FH are permitted to overlap each other at the same position.

After the target threshold is stored, steps S220 to S350 are repeated until all the prepared thresholds of 0 to 89 are stored (in step S360). After the thresholds of 0 to 89 are stored, a dot off threshold THoff is stored in each of vacant storage elements that have yet to store a threshold when all the thresholds of 0 to 89 are stored (in step S370). The dot off threshold THoff is a preset threshold that is larger than the input gradation values.

Figure 13B:
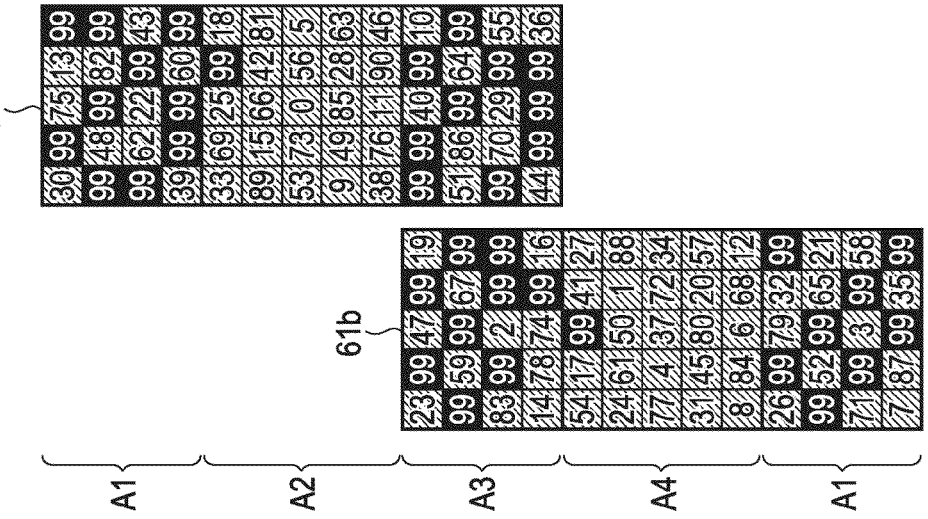
FIGS. 13A and 13B are diagram showing a state in which a dot off threshold THoff is stored in storage elements.
Figure 13A:
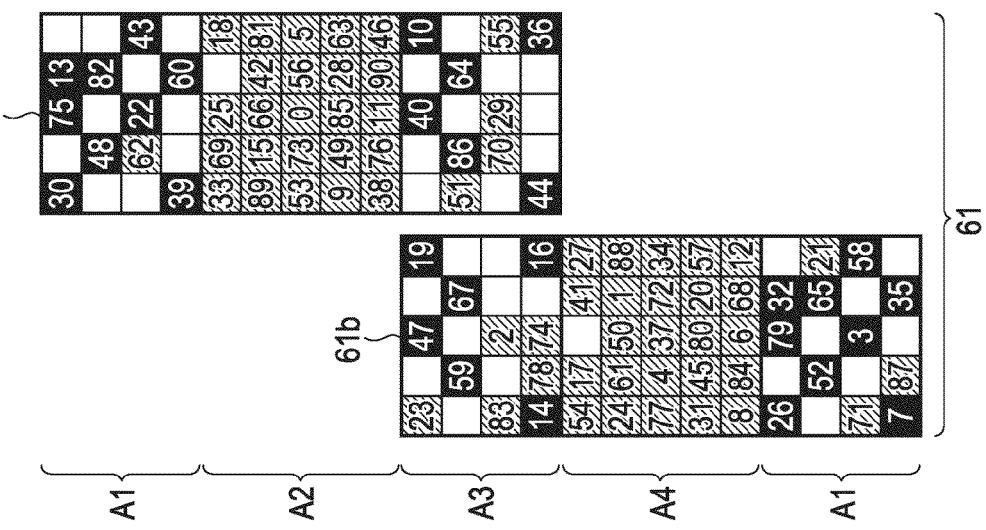

An example of step S360 is shown in FIGS. 13A and 13B. FIG. 13A shows the state in which all the prepared thresholds of 0 to 89 are stored in vacant storage elements by steps S210 to S360. In FIG. 13A, numbers shown in cells indicate the values of the stored thresholds, and cells in which the values of the thresholds are inversely highlighted indicate storage elements that correspond to positions at which dots are formed and overlap each other. As shown in FIG. 13B, in step S360, the dot off threshold THoff (indicated by 99 in FIG. 13B) is stored in each of vacant storage elements that have yet to store a threshold when all the thresholds of 0 to 89 are stored. In FIG. 13B, the dot off thresholds THoff stored in the storage elements are inversely highlighted. When all the storage elements of the preceding and following head storage regions 61a and 61b store any of the prepared thresholds of 0 to 89 or the dot off threshold THoff, the dither mask is completed.

A-5. Method for Calculating Comprehensive Evaluation Value CE

The method for calculating the comprehensive evaluation value CE is described below. The comprehensive evaluation value CE according to the present embodiment is calculated by the following Equation 2 using a first evaluation value E1, a second evaluation value E2 and adjustment coefficients $\alpha$ and $\beta$. The adjustment coefficients $\alpha$ and $\beta$ are coefficients that are specified on the basis of an experiment and a result of printing using the dither mask 61.

$$CE = \alpha \times E1 + \beta \times E2 \quad \text{(Equation 2)}$$

Figure 14:
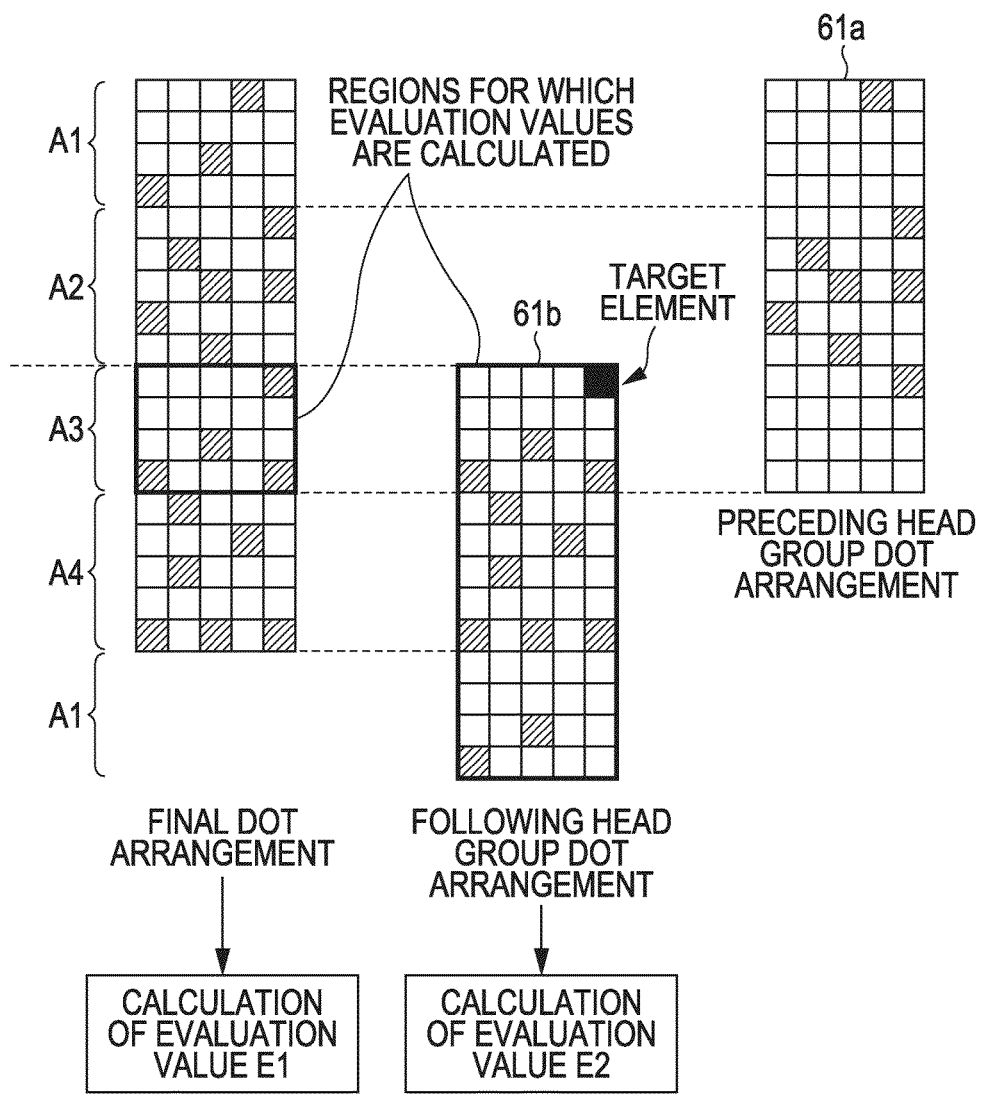
FIG. 14 is a diagram showing ranges of storage elements for which a first evaluation value and a second evaluation value are calculated in order to calculate comprehensive evaluation values.

The concepts of the first and second evaluation values E1 and E2 are different from each other. A range of storage elements for which the first evaluation value E1 is calculated is different from a range of storage elements for which the second evaluation value E2 is calculated. FIG. 14 is a diagram showing the range of the storage elements for which the first evaluation value E1 is calculated, and the range of the storage elements for which the second evaluation value E2 is calculated.

A frame shown on the right side of FIG. 14 indicates the preceding head storage region 61a. A frame shown on the central side of FIG. 14 indicates the following head storage region 61b. In FIG. 14, hatched cells indicate threshold-stored storage elements. The hatched cells that are included in the preceding head storage region 61a indicate a pattern (hereinafter also referred to as a preceding head group dot arrangement) of dots that are formed by the preceding head PH, while the hatched cells that are included in the following head storage region 61b indicate a pattern (hereinafter also referred to as a following head group dot arrangement) of dots that are formed by the following head FH. In addition, a pattern of dots that are formed by either the preceding head PH or the following head FH is also called a head group dot arrangement. A cell that is highlighted in black indicates the target element selected in step S260.

A frame shown on the left side of FIG. 14 indicates the state in which the preceding head storage region 61a and the following head storage region 61b overlap each other. In FIG. 14, hatched cells included in the frame shown on the left side of FIG. 14 indicate a pattern of the dots that are formed by both preceding and following heads PH and FH. This dot pattern shown on the left side of FIG. 14 is also called a final dot arrangement.

The first evaluation value E1 is calculated for storage elements that constitute a part of the final dot arrangement and are included in a segmented area (segmented area A3 in this case) that includes the target element. The second evaluation value E2 is calculated for storage elements that constitute a head group dot arrangement that corresponds to the preceding or following head storage region 61a or 61b that includes the target element. In the example shown in FIG. 14, since the target element is included in the following head storage region 61b, the second evaluation value E2 is calculated for the storage elements that constitute the following head group dot arrangement.

The first evaluation value E1 is described below in detail. The first evaluation value E1 is obtained by quantifying a variation (caused by dots that are formed on the printing sheet P by the preceding head PH and the following head HF and shifted from each other by a predetermined distance in a predetermined direction due to the difference between the case where the preceding head PH forms a dot and the case where the following head FH forms a dot) in dot coverage. The dot coverage is the ratio of the area of dots to be formed in a region (of the printing sheet P) that corresponds to the overlapping regions ORA to the area of the region of the printing sheet P. The dot coverage is also called coverage. A final dot arrangement that includes storage elements for which the first evaluation value E1 is calculated is a final dot arrangement that corresponds to dots (corresponding to pixels) that correspond to storage elements that have stored the thresholds in the steps described above and are to be formed and that is formed on the basis of an assumption that the target threshold is stored in the target element.

An example of the first evaluation value E1 is described below with reference to FIGS. 15 and 16A to 16E. As shown in FIG. 15, in order to calculate the first evaluation value E1, an N (N is an integer of 2 or more) types of shifted patterns are first estimated and specified (in step S311). The shifted patterns are each obtained by estimating a direction in which an ink dot is shifted from a target position, a distance that the ink dot is shifted from the target position, and a side toward which the ink dot is shifted. In the present embodiment, the shifted patterns include a pattern in which no dot is shifted. For example, formed ink dots are shifted in the direction (in which the printing sheet P is transported) due to the accuracy of transporting the printing sheet P is transported or the like. In addition, formed ink dots may be shifted toward any of top, bottom, left and right sides of the printing sheet P due to the accuracy of installation of the preceding head PH and the following head FH. The shifted patterns do not need to include the pattern in which not dot is shifted.

In the present embodiment, step s311 is performed to estimate a pattern 1 and a pattern 2. The pattern 1 indicates a state in which no dot is shifted, while the pattern 2 indicates a state in which the following head group dot arrangement is shifted by one pixel in the direction in which the printing sheet P is transported. An example of the shifted pattern 2 is described below. FIG. 16A shows the following head group dot arrangement (shown in FIG. 14) that is formed on the basis of an assumption that the threshold is stored in the target element. When the following head storage region has the following head group dot arrangement shown in FIG. 16A and the pattern 1 is used, the final dot arrangement of the segmented area A3 is an arrangement that is formed by simply overlapping the preceding head group dot arrangement with the following head group dot arrangement as shown in FIG. 16B. In FIG. 16B, a storage element that is represented by single hatching is included in the preceding head group dot arrangement, while storage elements that are represented by cross hatching are included in the following head group dot arrangement. In FIG. 16B, the storage element highlighted in black is included in both preceding and following head group dot arrangements. On the other hand, when the following head storage region has the following head group dot arrangement shown in FIG. 16A and the pattern 2 is used, the final dot arrangement of the segmented area A3 is formed by shifting the following head group dot arrangement (represented by cross hatching) by one pixel in the direction in which the printing sheet P is transported, as shown in FIG. 16C.

In the present embodiment, the number of the types of estimated shifted patterns is 2. However, the number of types of estimated shifted patterns is 3 or more. The estimated side toward which a dot is shifted is not limited to the side toward which the printing sheet P is transported. The estimated side toward which a dot is shifted may be the side from which the printing sheet P is transported. In addition, the estimated direction in which a dot is shifted is not limited to the direction in which the printing sheet P is transported. The estimated direction in which a dot is shifted may be a direction that is perpendicular to the direction in which the printing sheet P is transported. Furthermore, the estimated direction in which a dot is shifted is may be a direction that is different from the direction in which the printing sheet P is transported and from the direction perpendicular to the direction in which the printing sheet P is transported. The estimated distance that a dot is shifted is not limited to an integral multiple of one pixel and may be 1.5 pixels or 1.25 pixels. It is preferable that the shifted patterns be selected from patterns that are obtained on the basis of the accuracy of transporting the printing sheet in the printer 20 and the accuracy of installation of the printing heads 80.

After the shifted patterns are estimated, the shape of a dot is defined (in step S312). The dot shape to be defined is the shape of a dot that is actually formed when ink is deposited on the printing sheet P. The ink that is deposited on the printing sheet P by the ink jet printer spreads in a predetermined region and is fixed to the printing sheet P. The printer ejects the ink onto the printing sheet P while the printing heads and the printing sheet P move relative to each other. Thus, the ink easily spreads in directions of the relative movements. The definition of the dot shape is reflected in the actual shapes of dots formed in this manner and the dot shape is defined in order to accurately calculate the dot coverage.

FIG. 16D shows an example of the definition of the dot shape. In this example, resolution conversion is performed to increase, by two times, resolution in the direction in which the printing sheet P is transported and in the direction perpendicular to the direction in which the printing sheet P is transported so that each of pixels is converted into four pixels. After the resolution conversion, the shape of the dot is defined. Pixels (shown in FIG. 16D) that are represented by cross hatching correspond to a dot that is formed when ink does not spread. The pixels that are represented by cross hatching correspond to one of the pixels (shown in FIGS. 16B and 16C) represented by hatching or highlighted in black. Each of pixels (shown in FIG. 16D) that are represented by single hatching corresponds to a part of a dot that is formed when ink spreads. The resolution conversion is performed to increase the dot resolution. Thus, the definition of the dot shape can be reflected in the shapes of formed dots with high accuracy. In addition, it is possible to support the case where the estimated distance that the dot is shifted is not the integral multiple of one pixel. It is not necessary to define the dot shape and perform the resolution conversion.

After the dot shape is defined, the dot shape is reflected in each of the shifted patterns estimated in step S311, and the preceding head group dot arrangement and the following head group dot arrangement are overlapped (in step S313). The patterns (dot arrangements) 1 and 2, which are formed by the overlapping, are shown in FIG. 16E. The pattern 1 shown in FIG. 16E is obtained by reflecting the defined dot shape in each of the pixels included in the final dot arrangement (pattern 1) shown in FIG. 16B, while the pattern 2 shown in FIG. 16E is obtained by reflecting the defined dot shape in each of the pixels included in the final dot arrangement (pattern 2) shown in FIG. 16C. Pixels of the pattern 1 (shown in FIG. 16E), which are represented by cross hatching, match the pixels that are included in the final dot arrangement shown in FIG. 16B, while pixels of the pattern 2 (shown in FIG. 16E), which are represented by cross hatching, match the pixels that are included in the final dot arrangement shown in FIG. 16C. Pixels (shown in FIG. 16E) represented by single hatching correspond to the pixels (shown in FIG. 16D) represented by single hatching.

After the preceding head group dot arrangement and the following head group dot arrangement are overlapped, the coverage Cn is calculated for each of the N types of shifted patterns (in step S314). The coverage Cn is expressed by the following Equation 3.

$$Cn = (\text{number of pixels included in a region(corresponding to a printing region in which dots are to be formed)to be evaluated/number of total pixels of the region to be evaluated} \times 100) \quad \text{(Equation 3)}$$

For example, in the pattern 1 shown in FIG. 16E, the number of the total pixels of the segmented area A3 (that is the area to be evaluated) is 80, and the number of the pixels (represented by hatching) that are included in the segmented area A3 and correspond to regions in which dots are to be formed is 28. Thus, the coverage C1 of the pattern 1 is 35.0 (=28/80×100). In the pattern 2, the number of the pixels that are included in the segmented area A3 and correspond to regions in which dots are to be formed is 34. Thus, the coverage C2 of the pattern 2 is 42.5 (=34/80×100).

After the coverage Cn is calculated, the first evaluation value E1 is calculated on the basis of the coverage Cn (in step S315). In the present embodiment, the first evaluation value E1 is expressed by the following Equation 4.

$$E1 = \frac{\sqrt{\sum (Cn - \overline{Cn})^2}}{N} \quad \text{(Equation 4)}$$

In Equation 4, Cn is coverage (ratio of the area of dots formed on the basis of a shifted pattern n in a printing region to the area of the printing region), and N is the number of shifted patterns.

The first evaluation value E1 calculated in the aforementioned manner indicates a variation in the coverage Cn. The smaller the first evaluation value E1, the smaller the variation (caused by ink dots shifted from each other) in the coverage Cn. In other words, the smaller the first evaluation value E1, the lower the frequency of the occurrence of an irregularity (caused by ink dots that are formed in the region corresponding to the overlapping regions ORA and shifted) in the density of a printed image and the more degradation of the granularity is suppressed. Thus, when the first evaluation value E1 is small, the quality of the printed image and the granularity are excellent.

Next, the second evaluation value E2 is described in detail. The second evaluation value E2 indicates a distribution of dots to be formed on the basis of a head group dot arrangement that corresponds to the preceding or following head storage region 61a or 61b that includes the target element. In other words, the second evaluation value E2 indicates the degree of uniformity of distributed dots. A head group dot arrangement that is to be evaluated by means of the second evaluation value E2 is a head group dot arrangement that corresponds to dots (corresponding to pixels) that correspond to storage elements that have stored the thresholds in the steps described above and are to be formed and that is formed on the basis of an assumption that the target threshold is stored in the target element. It is known that a dither mask that has blue noise characteristics (shown in FIG. 17) or green noise characteristics (shown in FIG. 17) is formed in order to form dots that are uniformly distributed.

Figures 18A, 18B, 18C:
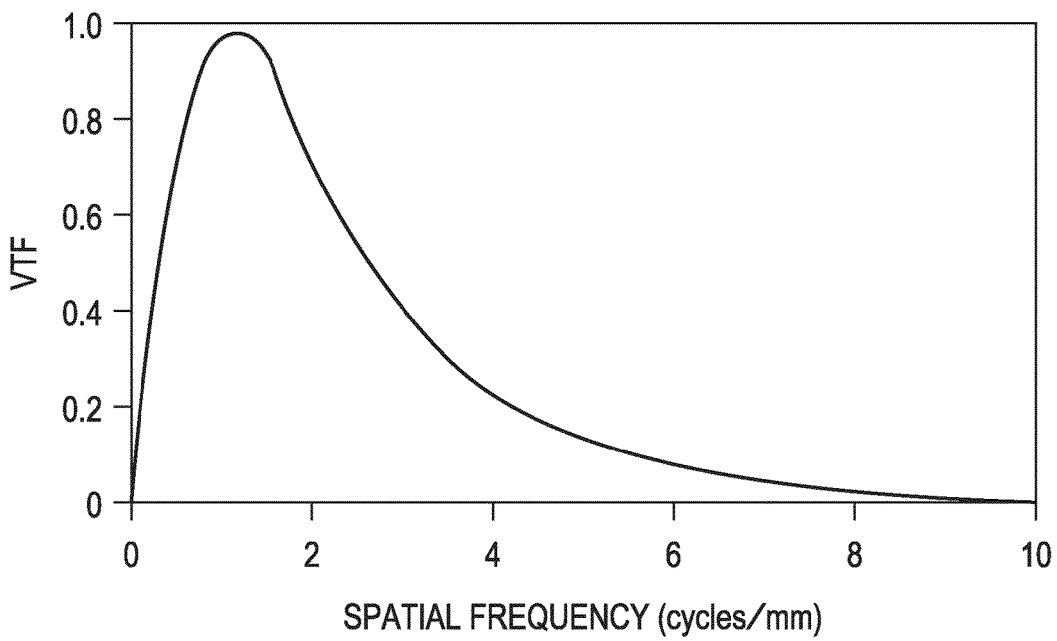
FIGS. 18A to 18C are diagrams showing a method for calculating the second evaluation value.

As the second evaluation value E, a granularity index can be used, for example. Since a technique using the granularity index is known (for example, JP-A-2007-15359), the technique is not described in detail. A Fourier transform is performed on an image so that a power spectrum FS is obtained. The power spectrum FS is weighted by a weight that corresponds to a visual transfer function (VTF) for a spatial frequency in human vision. The granularity index is obtained by integrating the weighted power spectrum FS with respect to the spatial frequency. FIG. 18A shows an example of the VTF. Various experimental equations to calculate the VTF have been proposed. A typical one of the experimental equations is shown in FIG. 18B. In FIG. 18B, a variable L is an observation distance (between a human eye and the image) and a variable u is the spatial frequency. The granularity index can be calculated by an equation shown in FIG. 18C on the basis of the VTF. In FIG. 18C, a variable K is a coefficient that is provided to fit a value obtained by the integration to human sense. As is apparent from the calculation, it can be said that the granularity index indicates whether or not a person feels that dots are noticeable. The smaller the second evaluation value E2, the less visible dots included in the printed image and the more excellent the quality of the printed image.

It can be said that the comprehensive evaluation value CE according to the present embodiment is an evaluation value that allows a variation in the coverage Cn in the printing region corresponding to the overlapping regions ORA to be reduced and a distribution of dots (to be formed on the basis of the head group dot arrangement) to be excellent and causes the variation and the distribution to be at predetermined levels.

A-6. Method for Using Dither Mask

A method for using the dither mask 61 in the halftone process (step S130) is described below. The method for using the dither mask 61 is based on the fact that the dither mask 61 includes the preceding head storage region 61a and the following head storage region 61b or includes the overlapped segmented areas A1 and A3. FIG. 19A shows positional relationships between the preceding heads PH and the following heads FH. FIG. 19B shows regions of image data D that is to be subjected to the halftone process. As shown in FIGS. 19A and 19B, regions of image data, which correspond to the overlapping regions ORA1, are called image data D1, D11, D21 and the like. Regions of image data, which correspond to the non-overlapping regions SA1, are called image data D2, D12 and the like. Regions of image data, which correspond to the overlapping regions ORA2, are called image data D3, D13 and the like. Regions of image data, which correspond to the non-overlapping regions SA2, are called image data D4, D14 and the like.

Before the dither mask 61 is used for the image data D and the halftone process is performed, the regions (image data D1, D3, D11 and D13 shown in FIG. 19B) of the image data D, which correspond to the overlapping regions ORA1 and ORA2, are copied so that image data DR that is continuously arranged in the direction in which the printing heads are arrayed is formed as shown in FIG. 19C. As shown in FIG. 19D, the preceding head storage region 61a and the following head storage region 61b are rearranged on the basis of the arrangement of the image data DR and the array of the preceding and following heads PH and FH and form the dither mask 61. Then, the formed dither mask 61 is repeatedly arranged in the direction in which the printing heads are arrayed. Then, the halftone process is performed using the formed dither mask 61.

The halftone process may be performed using the dither mask 61 in a manner described below. FIGS. 20A to 20C correspond to FIGS. 19A to 19C. FIG. 20D shows a method for applying the dither mask 61 to the image data DR. In this example shown in FIG. 20D, the halftone process is performed using the dither mask 61 that is formed by combining the preceding head storage region 61a and the following head storage region 61b that are arranged without a rearrangement so that the regions of the image data DR, which correspond to the overlapping region ORA1, the non-overlapping region SA1, the overlapping region ORA2 and the non-overlapping region SA2, correspond to the segmented areas A1 to A4 and that is repeatedly arranged in the direction in which the printing heads are arrayed. The dither mask 61 may be used as long as the regions of the image data DR, which correspond to the overlapping region ORA1, the non-overlapping region SA1, the overlapping region ORA2 and the non-overlapping region SA2, correspond to the segmented areas A1 to A4.

A-7. Effects

The dither mask 61 that is generated by the aforementioned method has the preceding head storage region 61a and the following head storage region 61b. The dither mask 61 includes the storage elements so that the storage elements that correspond to the overlapping region ORA of the preceding head PH and are included in the preceding head storage region 61a overlap the storage elements that correspond to the overlapping region ORA of the following head FH and are included in the following head storage region 61b. In addition, a storage element in which a threshold is to be stored is selected on the basis of the comprehensive evaluation values CE that each vary depending on whether the threshold is stored in the preceding head storage region 61a or the following head storage region 61b. Thus, the dither mask 61 and the assignment information that indicates whether the preceding head PH or the following head FH forms a dot can be simultaneously generated in a series of the processes.

Therefore, the dither mask 61 can be generated while the balance of assigning, to the overlapping regions ORA of the preceding and following heads PH and FH, dot patterns (for each gradation) that are formed by means of the dither mask 61 is controlled. When the halftone process is performed using the dither mask 61 generated in the aforementioned manner, it is possible to suppress an abrupt change (due to a change in the gradations) of assignment to the overlapping regions ORA of the printing heads. As a result, the amount of a variation (caused by shifted ink dots) in densities of dots for each gradation is reduced, and it is possible to suppress a reduction in the quality of an image printed in the region that corresponds to the overlapping regions ORA. The storage elements in which the thresholds are to be stored are determined under the condition that dots are permitted to be formed by the preceding head PH and the following head FH at the same position in the region that corresponds to the overlapping regions ORA. Thus, it is possible to increase a selection range of a storage element in which a threshold is to be stored. Therefore, it is possible to select a storage element in which the threshold is to be stored and for which an evaluation value has been calculated and is the most appropriate among the calculated evaluation values.

In the method for generating the dither mask 61, candidates (hereinafter also referred to as candidate storage elements) for a storage element in which the target threshold is to be stored are narrowed down on the basis of the following requirements: the balance of threshold-stored storage elements included in each of the segmented elements A1 to A4; the balance of threshold-stored storage elements included in each of the rasters located in the segmented areas that correspond to the overlapping regions ORA; and consistency with the set printing rate. Thus, the balance of the dot arrangements in the segmented areas that correspond to the overlapping regions ORA can be controlled with high accuracy. As a result, the dither mask 61 that can reduce the amount of a variation (caused when ink dots are shifted) in densities of dots can be generated. In addition, the candidates for a storage element in which the target threshold is to be stored are limited to a small number of elements on the basis of the aforementioned requirements. Thus, the number of comprehensive evaluation values CE to be calculated can be reduced, and the process for generating the dither mask 61 can be efficiently performed. For the aforementioned requirements, the acceptable ranges are provided for the optimal balance and the like. Compared with the case where the acceptable ranges are not provided for the optimal balance and the like, a storage element for which a comprehensive evaluation value CE has been calculated and is optimal can be selected from among a wide range of the candidate storage elements, and the amount of a variation (caused when ink dots are shifted) in densities of dots can be reduced.

In the method for generating the dither mask 61, a distribution of dots (to be formed on the basis of a head group dot arrangement that includes the target element in which the target threshold is to be stored) is evaluated using the second evaluation value E2 so that the target element is evaluated. Thus, it is possible to ensure a distribution of dots that are to be formed in the region corresponding to the non-overlapping region SA of each of the preceding and following heads PH and FH. Therefore, the dither mask 61 can be generated, which ensures an excellent image that is printed in the region that corresponds to each of the non-overlapping regions SA. In addition, the candidate storage elements are evaluated so that a variation in the coverage Cn (calculated for each of the estimated shifted patterns) of dots to be formed on the basis of the final dot arrangement of the segmented area that includes the target element is reduced using the first evaluation value E1. Thus, even when dots are formed in a pattern that corresponds to any of the shifted patterns, the amount of a variation in densities of dots formed in the region that corresponds to the overlapping regions ORA can be reduced by a constant amount. Thus, the dither mask 61 can be generated, which can suppress a reduction (caused by shifting of ink dots formed by the overlapping portions (overlapping region ORA)) in the quality of a printed image.

In the method for generating the dither mask 61, the estimated shifted patterns include the pattern in which not dot is shifted. Thus, even when ink dots are not shifted, a variation of the coverage can be suppressed.

In the method for generating the dither mask 61, only a variation in dot coverage that is the ratio of the area of dots to be formed in the printing region corresponding to the overlapping regions ORA on the basis of the final dot arrangement to the area of the printing region is evaluated without consideration of a distribution of the dots to be formed in the printing region (corresponding to the overlapping regions ORA) on the basis of the final dot arrangement. Thus, it is possible to maximally suppress the occurrence of an irregularity in the density of dots.

The printer 20 that includes the dither mask 61 generated by the method has a function of the density difference correcting section 44. An irregularity in the density of dots formed in the printing region that corresponds to the overlapping regions ORA may be caused by dots shifted by constant amounts due to misalignment of the printing heads or the like or may be caused by dots shifted by amounts (due to a problem with the accuracy of transporting a printing sheet) that vary for each printing operation. The function of the density difference correcting section 44 is capable of suppressing the occurrence of an irregularity (in the density of dots) that is caused by dots shifted by constant amounts. Thus, it is possible to further suppress an irregularity in the density of dots, since the dither mask 61 also can suppress the irregularity in the density of the dots. In other words, when the printer 20 performs the halftone process using the dither mask 61 and performs printing, an acceptable range of a distance between ink dots that are formed and shifted from each other can be increased so that an irregularity in the density of dots is not noticeable.

Examples of characteristics and effects of the dither mask 61 generated by the method are described with reference to FIGS. 26A to 27C. FIG. 26A shows the positional relationship between the preceding head PH and the following head FH that are included in the printer 20. The preceding head PH and the following head FH each have the overlapping region ORA. FIG. 26B shows an arrangement of dots that are formed in the printing region corresponding to the overlapping regions ORA and in regions near the printing region corresponding to the overlapping regions ORA when a dither mask that is generated by a conventional method is used. As shown in FIG. 26B, when the formed ink dots are not shifted, the dots are adequately distributed.

It is apparent that when the arrangement of the formed dots is divided into a preceding head group dot arrangement and a following head group dot arrangement, irregularities in densities of dots are locally present in the printing region that corresponds to the overlapping regions ORA. This is due to the fact that after the dither mask is generated, assignment to the overlapping regions ORA of the preceding and following heads PH and FH is performed so that the granularity of formed dots can be ensured. As a result, the irregularities in the densities of the formed dots are locally present since ink dots are shifted from target positions (or are shifted by three pixels in this example) as shown in FIG. 26B.

FIG. 26C shows an arrangement of dots that are formed in the printing region corresponding to the overlapping regions ORA and in regions near the printing region corresponding to the overlapping regions ORA when the dither mask 61 generated by the method according to the present embodiment is used. As shown in FIG. 26C, when formed ink dots are not shifted, the dots are adequately distributed. It is apparent that when the arrangement of the formed dots is divided into the preceding head group dot arrangement and the following head group dot arrangement, dots are adequately distributed in the printing region corresponding to the overlapping regions ORA on the basis of the preceding and following head group dot arrangements. This is due to the fact that: the dither mask 61 is constituted by the preceding and following head storage regions 61a and 61b in which the segmented areas A1 or A3 overlap each other (or in which the segmented areas A1 overlap each other and the segmented areas A3 overlap each other); the assignment to the preceding and following heads PH and FH and the storage of the thresholds in the dither mask 61 are simultaneously performed; and arrangements of dots that are to be formed in the printing region corresponding to the overlapping portions are controlled using the comprehensive evaluation values CE. Thus, it is possible to suppress the occurrence of a local irregularity in the density of dots even when the formed ink dots are shifted from target positions (by three pixels in the direction in which the printing sheet is transported in this example). In addition, the first evaluation value E1 is calculated under the condition that dots are permitted to be formed and overlapped in the regions that correspond to the segmented areas A1 and A3. Thus, a variation in the coverage Cn is suppressed, and the effect of suppressing the occurrence of an irregularity in the density of dots is improved.

Figure 27A:
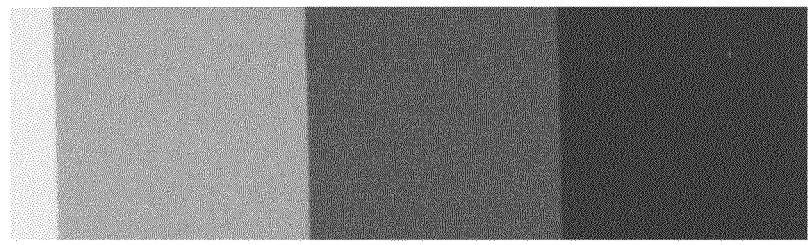
FIGS. 27A to 27C are diagrams showing an effect of the invention.
Figure 27B:
Figure 27C:

FIG. 27A shows an image that is used for evaluation and is a result that needs to be printed in the printing region that corresponds to the overlapping regions ORA. As shown in FIG. 27B, when the conventional method is used, a printed result is obtained, in which a reduced level of granularity and irregularities in densities of dots are noticeable. Image portions indicated by ORA in FIGS. 27B and 27C each correspond to the overlapping regions ORA and are a joint region that is constituted by side regions (adjacent to each other) of the bands J and J+1. In the present embodiment, it is apparent from FIG. 27C that a reduction in the level of granularity and an irregularity in the density of dots are significantly suppressed.

B. Modified Examples

Modified examples of the aforementioned embodiment are described below.

B-1. First Modified Example

In the aforementioned embodiment, the dither mask 61 is formed by the aforementioned method and includes the preceding and following head storage regions 61a and 61b in which the segmented areas A1 or A3 overlap each other (or in which the segmented areas A1 overlap each other and the segmented areas A3 overlap each other). The dot off threshold THoff is stored in each of vacant storage elements that have yet to store any of the prepared thresholds. However, the dither mask 61 is not limited to the aforementioned configuration. FIG. 21 shows a process (according to the first modified example) of generating the dither mask 61. The process shown in FIG. 21 corresponds to the process (for generating the dither mask 61) shown in FIG. 7. The process shown in FIG. 6 is performed in the first modified example. In FIG. 21, the same steps as in FIG. 7 are indicated by the same reference numerals as in FIG. 7, and a description of the steps is omitted. Steps shown in FIG. 21, which are different from the process shown in FIG. 7, are described below. When the target threshold is stored in the most appropriate element, it is determined whether or not the storage element that has stored the target threshold is included in the segmented area A1 or A3 (corresponding to the overlapping region ORA1 or ORA3) (in step S352). When the storage element that has stored the target threshold is included in the segmented area A1 or A3 (the answer is YES in step S352), a preceding head identification mask 63 and a following head identification mask 64 are updated (in step S354).

Figure 22:
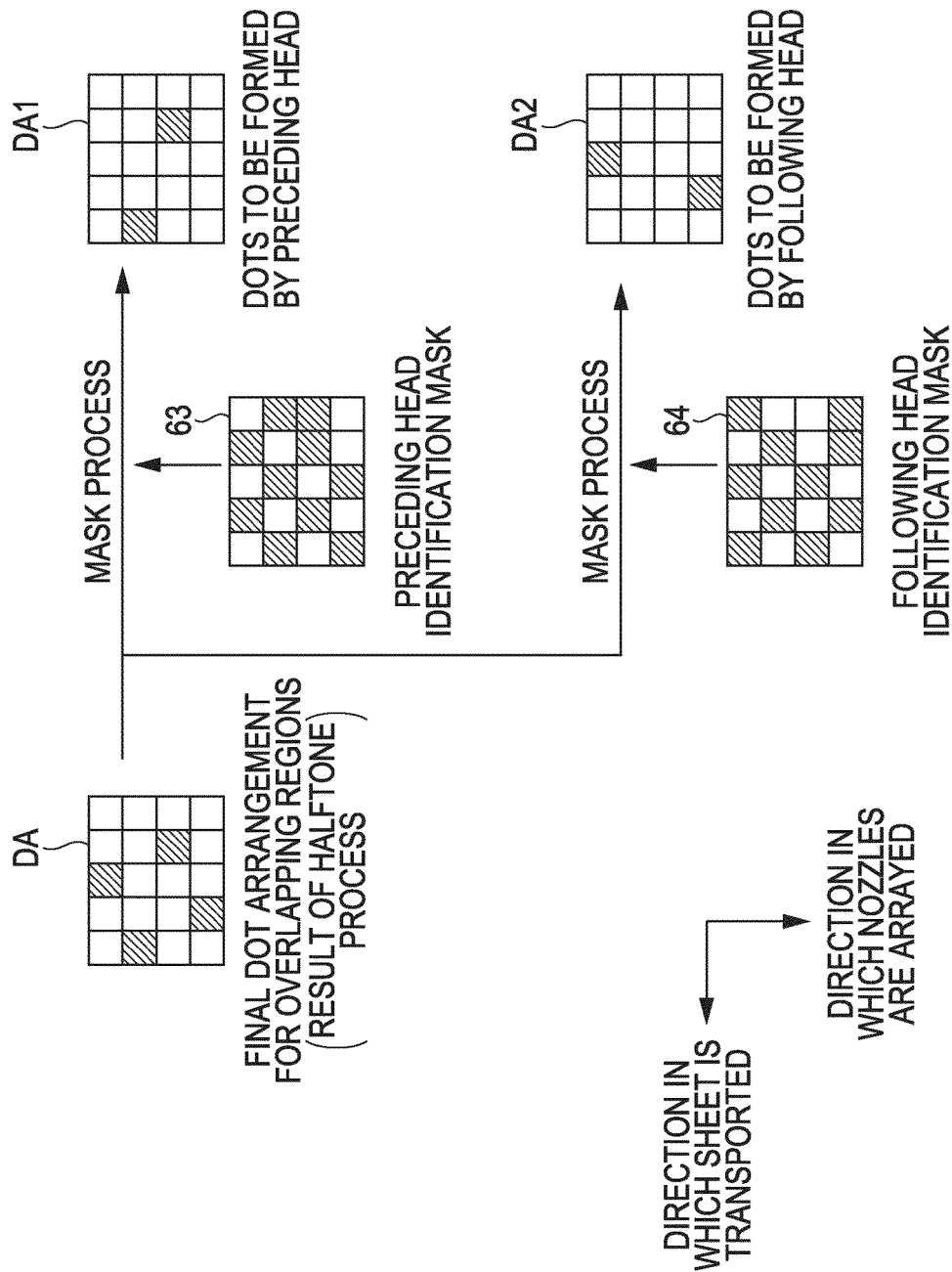
FIG. 22 is a diagram showing a method for using a preceding head identification mask and a following head identification mask.

The preceding head identification mask 63 and the following head identification mask 64 are used to identify whether the preceding head PH or the following head FH forms dots at appropriate positions in the region that corresponds to the overlapping regions ORA. FIG. 22 shows an example of a method for using the preceding head identification mask 63 and the following head identification mask 64. A final dot arrangement DA shown in FIG. 22 is an example of the result of the halftone process (step S130) that is performed on image data to be printed in the region corresponding to the overlapping regions ORA. Cells shown in FIG. 22 indicate pixels of image data. In the arrangement DA, cells that are hatched indicate pixels that correspond to dots that are determined to be formed in the halftone process, while cells that are not hatched indicate pixels that correspond to dots are determined not to be formed in the halftone process.

The preceding head identification mask 63 stores data on the positions of pixels that are included in the image data to be printed in the region corresponding to the overlapping regions ORA and that correspond to dots that are to be formed by the preceding head PH. Cells that are included in the preceding head identification mask 63 and hatched indicate pixels that correspond to dots that are to be formed by the preceding head PH. Cells that are not hatched and are included in the preceding identification mask 63 indicate pixels that correspond to dots that are not to be formed by the preceding head PH or indicate pixels that correspond to dots that are to be formed by the following head FH.

A mask process is performed on the dot arrangement DA using the preceding head identification mask 63 so that pixels that correspond to dots to be formed by the preceding head PH can be selected from the dot arrangement DA. Specifically, dots that correspond to the following pixels are actually formed by the preceding head PH: pixels that are included in the dot arrangement DA and correspond to dots to be formed and overlap pixels that correspond to dots to be formed and are included in the preceding head identification mask 63. The arrangement of the dots that are actually formed by the preceding head PH is indicated by DA1 in FIG. 22.

The following head identification mask 64 stores data on the positions of pixels that are included in the image data to be printed in the region corresponding to the overlapping regions ORA and that correspond to dots that are to be formed by the following head FH. The positions of pixels that correspond to dots to be formed and are included in the following head identification mask 64 correspond to the positions of pixels that are included in the preceding head identification mask 63 and correspond to dots that are not to be formed. The positions of pixels that are included in the following head identification mask 64 and correspond to dots that are not to be formed correspond to the positions of pixels that are included in the preceding head identification mask 63 and correspond to dots that are to be formed. A mask process is performed on the dot arrangement DA using the following head identification mask 64 so that pixels that correspond to dots to be formed by the following head FH can be selected from the dot arrangement DA. The arrangement of dots that correspond to the selected pixels is indicated by DA2 in FIG. 22. The dot arrangement DA2 can be determined by selecting pixels that are included in the dot arrangement DA and are to be formed and that overlap the pixels that are included in the preceding head identification mask 63 and are not to be formed.

Figure 23A:
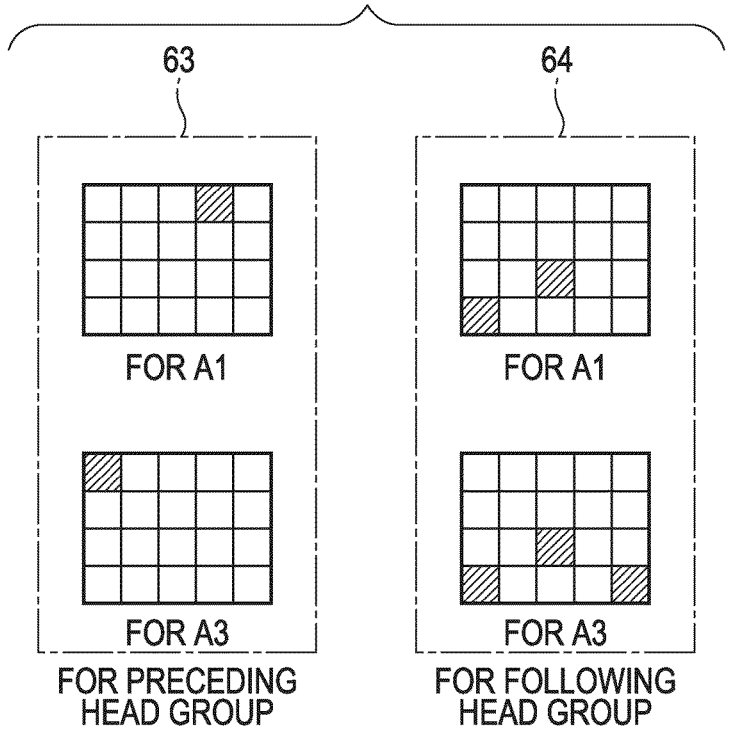
FIGS. 23A and 23B are diagrams showing a method for updating the preceding head identification mask and the following head identification mask.
Figure 23B:
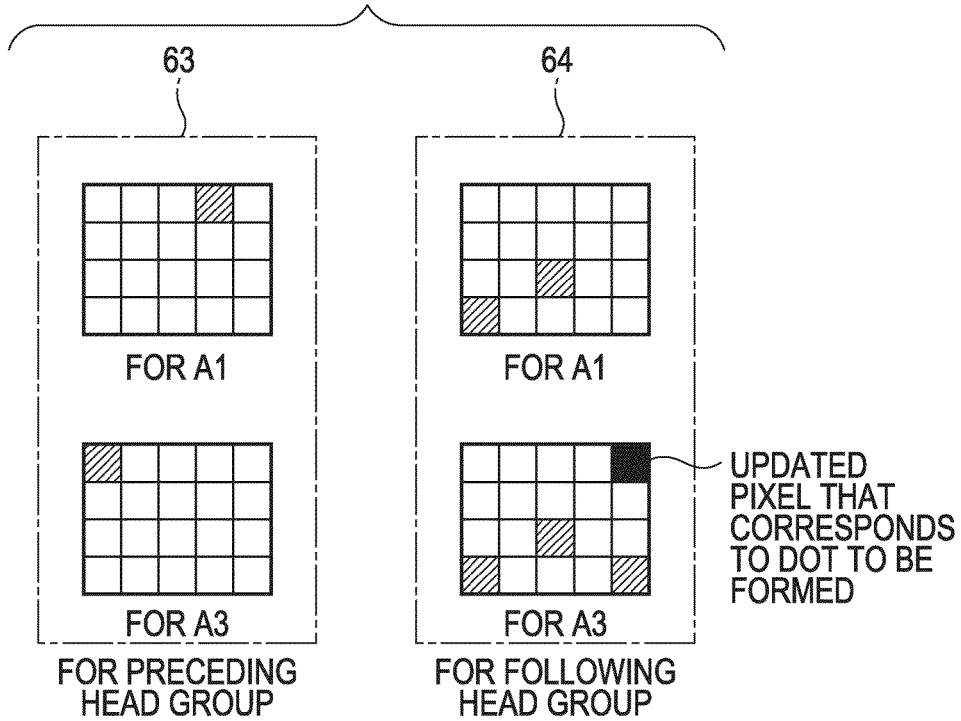

FIGS. 23A and 23B show an example of updating the preceding head identification mask 63 and the following head identification mask 64 in step S354. FIG. 23A shows the preceding head identification mask 63 and the following head identification mask 64 before the updating. Pixels that are included in the preceding head identification mask 63 and hatched indicate pixels that correspond to dots to be formed by the preceding head PH. Pixels that are included in the following head identification mask 64 and hatched indicate pixels that correspond to dots to be formed by the following head FH.

FIG. 23B shows the updated preceding head identification mask 63 and the updated following head identification mask 64. In step S354, the following pixel is updated so that a dot that corresponds to the pixel is to be formed: a pixel that is included in the identification mask 63 or 64 that corresponds to the head storage region 61a or 61b that includes the storage element that has stored the target element in step S350. In the example shown in FIG. 23B, the target element is stored in the following head storage region 61b as shown in FIG. 12. The pixel of the following head identification mask 64, which corresponds to the position of the storage element that has stored the target element, is updated so that a dot that corresponds to the updated pixel is formed.

When the preceding head identification mask 63 and the following head identification mask 64 are updated in the aforementioned manner, or when the storage element that has the target element stored therein is not included in the segmented area A1 or A3 (or the answer is NO in step S352), the aforementioned steps S220 to 5354 are repeated until all the prepared thresholds of 0 to 89 are stored (in step S360). When all the thresholds of 0 to 89 are stored, a certain threshold is stored in vacant storage elements that have yet to store a threshold when step 360 is performed (in step S375). The certain threshold stored in step S375 may be any value. The dither mask 61 is completed by storing any of the prepared thresholds of 0 to 89 or the dot off threshold in each of all the storage elements of the preceding and following head storage regions 61a and 61b.

The dither mask 61, the preceding head identification mask 63 and the following head identification mask 64 are generated in the series of processes that are interrelated with each other. After the halftone process (step S130) is performed, an assignment process is performed using the preceding head identification mask 63 and the following head identification mask 64 in the printing process to assign information on whether the preceding head PH or the following head FH forms a dot at an appropriate position in the region that corresponds to the overlapping regions ORA. Thus, a printed result that is the same as or similar to the result printed in the embodiment can be obtained.

B-2. Second Modified Example

In the aforementioned embodiment, the first evaluation value E1 is calculated by Equation 4. The calculation of the first evaluation value E1 is not limited to the calculation using Equation 4. The first evaluation value E1 may be a variance or standard deviation of the coverage Cn. In addition, the first evaluation value E1 may be a value obtained by summing differences between all pairs of the coverage Cn calculated for each of the shifted patterns. Furthermore, the first evaluation value E1 may be a value obtained by summing the differences weighted by a predetermined weight. The first evaluation value E1 may be any value as long as a variation in the coverage Cn can be evaluated.

The first evaluation value E1 is not limited to a value that is used to evaluate a variation in the coverage Cn. The first evaluation value E1 may be any evaluation value that is obtained by quantifying a variation (caused by ink dots formed and shifted from target positions) in the coverage Cn in the printing region corresponding to the overlapping regions ORA. For example, the first evaluation value E1 may be the largest difference among differences between the coverage Cn calculated for each of the shifted patterns (in which dots are shifted) and the coverage Cn calculated for the pattern in which not dot is shifted. In addition, the first evaluation value E1 may be the largest difference among differences between all pairs of the coverage Cn calculated for the shifted patterns. Even when any of those first evaluation values E1 is used, the dither mask 61 and the like, which reduce a variation in the coverage Cn to a predetermined level or lower, can be generated. Thus, it is possible to suppress the occurrence of an irregularity in the density of dots and a reduction in the level of granularity.

B-3. Third Modified Example

In the segmented area selecting process and the head group selecting process in the aforementioned embodiment, the segmented areas, the rasters and the assignment information are narrowed down on the basis of the balance of a dot arrangement to areas, rasters and assignment information that are in the predetermined acceptable ranges in order to select a storage element in which the target threshold to be stored. The acceptable ranges may not be provided. For example, in the segmented area selecting process (step S230), a segmented area may be selected so that the difference between the largest and smallest proportions among the proportions of the numbers of threshold-stored storage elements among the numbers of the storage elements included in the segmented areas is minimized.

The head group selecting process (step S240) may be performed so that when it is assumed that the target threshold is stored in each of the rasters, the number of threshold-stored storage elements included in each of the rasters is set to a value so that the difference between the smallest and largest numbers is minimized. The assignment information may be narrowed down so that when it is assumed that the target threshold is stored in each of the rasters selected by the narrowing-down process and the storage elements in which the target threshold is stored are assigned to either the preceding head PH or the following head FH, the number of threshold-stored storage elements included in each of the rasters selected by the narrowing-down process is set to a value so that differences between the numbers of the threshold-stored storage elements included in each of the rasters and the ideal assignment values are minimized. In this case, the number of times of the calculation of the comprehensive evaluation values CE can be reduced. Thus, the process can be performed on the dither mask 61 and the like at a high speed. An acceptable range may be used in some of the processes on the basis of the types of requirements, while an acceptable range may not be used in the other processes on the basis of the types of requirements.

B-4. Fourth Modified Example

In the present embodiment, in the process of generating the dither mask 61, the second evaluation value E2 is calculated for the head group dot arrangement that corresponds to the preceding or following head storage region 61a or 61b that includes the target element. However, the second evaluation value E2 may be calculated for the head group dot arrangements that correspond to the preceding and following head storage region 61a and 61b. For example, the second evaluation value E2 may be calculated by the following Equation 5 using adjustment factors 7 and 8, an evaluation value E2ph for the preceding head dot arrangement, and an evaluation value E2fh for the following head dot arrangement. In addition, the second evaluation value E2 may be calculated for the head group dot arrangements and the final dot arrangement.

$$E2=\gamma E2ph+\delta E2fh \qquad \text{(Equation 5)}$$

B-5. Fifth Modified Example

In the aforementioned embodiment, the comprehensive evaluation values CE each include the first evaluation value E1 and the second evaluation value E2. However, the comprehensive evaluation values CE may not include the evaluation value E2. For example, the dither mask 61 that is generated only by the first evaluation value E1 may be evaluated. In this case, the dither mask 61 and the like can be generated so that a variation in the coverage is reduced. Thus, it is possible to suppress, to some extent, the occurrence of an irregularity in the density of dots and a reduction in the level of granularity. The second evaluation value E2 is not limited to an index that is used to evaluate a distribution of dots. The second evaluation value E2 may be any evaluation value as long as features that need to be included in the dither mask 61 are evaluated by means of the second evaluation value E2. For example, the second evaluation value E2 may be an index that is used to evaluate a concentration of dots.

B-6. Sixth Modified Example

In the aforementioned embodiment, the granularity index is used as the second evaluation value E2. However, the second evaluation value E2 may be any evaluation value as long as the second evaluation value E2 is used to evaluate a distribution of dots. For example, RMS granularity may be used as the second evaluation value E2. A technique using the RMS granularity is a known technique (for example, refer to JP-A-2007-174272). Thus, the RMS granularity is not described in detail. The RMS granularity is calculated by performing a low-pass filter process using a low-pass filter on a dot density and calculating a standard deviation of the dot density subjected to the low-pass filter process. In addition, the dot density subjected to the low-pass filter process may be used as the second evaluation value E2. In this case, the dot density subjected to the low-pass filter process serves as an evaluation value that is used in a potential method.

B-7. Seventh Modified Example

In the aforementioned embodiment, in the head group selecting process, a distribution of dots is ensured on a raster basis by narrowing down the rasters to candidate rasters so that the threshold setting ratios (calculated for the rasters of the segmented areas A1 and A3 (corresponding to the overlapping regions ORA) are in the predetermined range and substantially equal to each other. It is not necessary to control a distribution of dots on a raster basis when the following index is used: an index that allows a distribution of dots to be evaluated and in which the difference between dot formation rates of the preceding and following heads PH and HF in the region corresponding to the overlapping regions ORA and the difference between dot formation rates of the preceding and following heads PH and HF in each of regions corresponding to the non-overlapping regions SA are reflected.

B-8. Eight Modified Example

In the aforementioned embodiment, all the prepared thresholds of 0 to 89 are each stored by the method shown in FIGS. 6 and 7 in any of the storage elements included in the preceding and following head storage regions 61a and 61b. Some of the prepared thresholds may not be stored by the aforementioned method. For example, some of the prepared thresholds may be stored by the aforementioned method only in intermediate gradation regions (included in the segmented areas that correspond to the overlapping regions ORA) that correspond to regions in which an irregularity in the density of dots easily occurs and the level of granularity is easily reduced.

B-9. Ninth Modified Example

The embodiment describes the method for generating the dither mask 61 that is used in the halftone process performed by the line printer, and the configuration of the line printer that stores the dither mask 61 generated by the aforementioned method. The invention can be applied to a printing device such as a band-pass scanning type serial printer that includes a non-overlapping region and an overlapping region, ejects ink while moving a printing head in the main scanning direction and the auxiliary scanning direction relative to a printing medium, forms a part of a raster (that is a dot line that extends in the main scanning direction) by performing main scanning one time in a region corresponding to the non-overlapping region, forms the other part of the raster by performing main scanning two times in a region corresponding to the overlapping region so that an image is printed.

Figure 24:
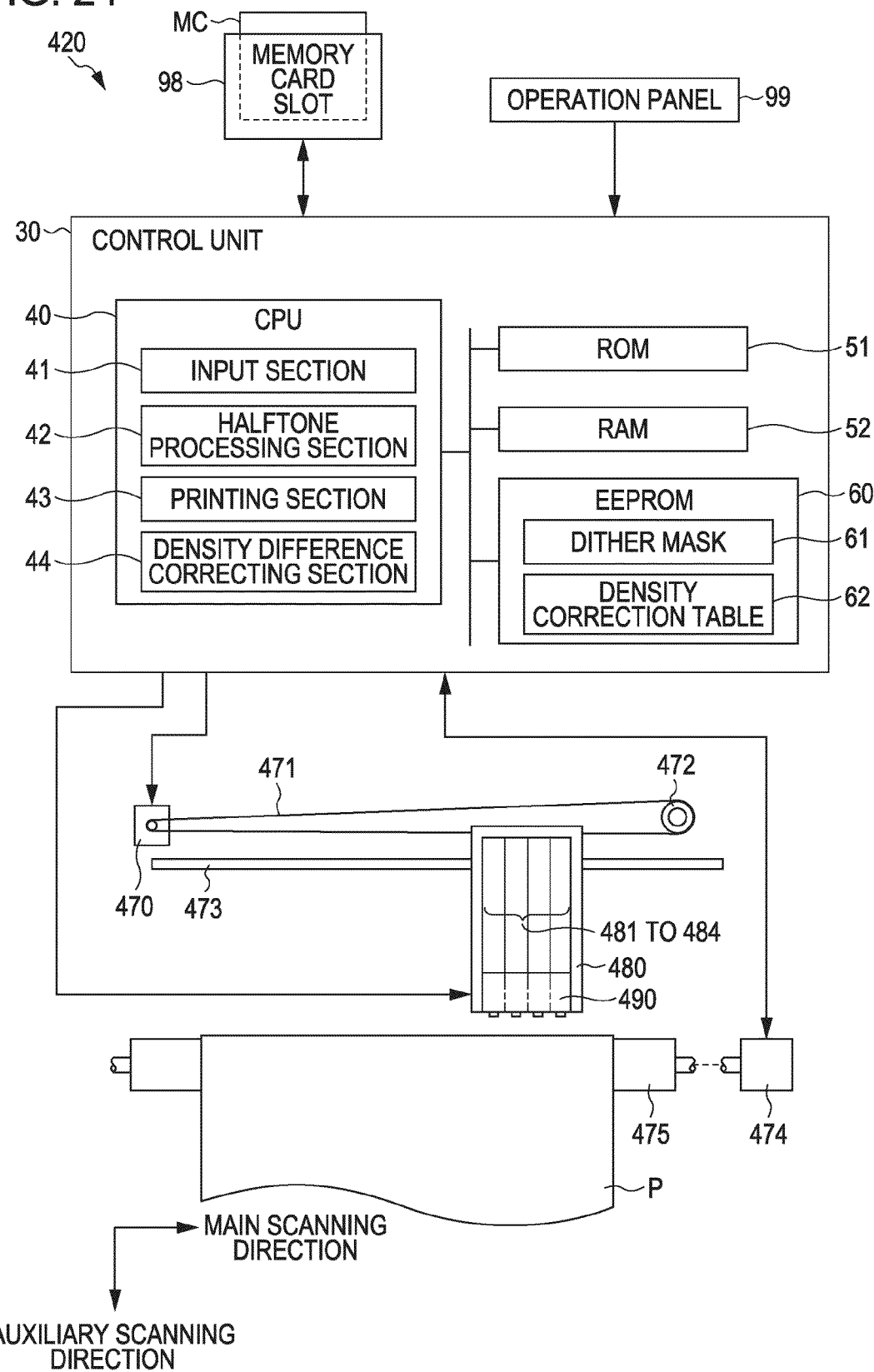
FIG. 24 is a diagram showing the outline configuration of a printer according to another modified example.

The configuration of the band-pass scanning type serial printer is shown in FIG. 24. FIG. 24 is an outline diagram showing the configuration of a printer 420 according to the ninth modified example. In FIG. 24, the same elements as the printer 20 (shown in FIG. 1) according to the embodiment are indicated by the same reference numerals as in FIG. 1, and a description of the elements is omitted. The printer 420 is a serial ink jet printer. As shown in FIG. 24, the printer 420 includes: a mechanism that transports a printing sheet P by means of a sheet feeding motor 474; a mechanism that causes a carriage motor 470 to move a carriage 480 so that the carriage 480 reciprocates in a direction in which a shaft of a platen 475 extends; a mechanism that drives printing heads 490 that are installed to the carriage 480 and causes the printing heads 490 to eject ink so that dots are formed; and the control unit 30 that controls signals that are transferred among the sheet feeding motor 474, the carriage motor 470, the printing heads 490 and the operation panel 99.

The mechanism that causes the carriage 480 to reciprocate extends along the shaft of the platen 475 and includes: a sliding shaft 473 that holds the carriage 480 so that the carriage 480 is slidable; and a pulley 472 that is arranged so that an endless driving belt 471 is stretched between the pulley 472 and the carriage motor 470.

Ink cartridges 481 to 484 that correspond to cyan ink, magenta ink, yellow ink and black ink are installed to the carriage 480. Nozzle arrays that correspond to cyan ink, magenta ink, yellow ink and black ink are provided in each of the printing heads 490 that are provided on the lower side of the carriage 480. When the ink cartridges 481 to 484 are installed to the carriage 480 from the upper side of the carriage 480, the cartridges can supply the ink to the printing heads 490.

The printer 420 that has the aforementioned hardware configuration drives the carriage motor 470 so that the carriage motor 470 causes the printing heads 490 to reciprocate in the main scanning direction with respect to the printing sheet P. In addition, the printer 420 drives the sheet feeding motor 474 so that the sheet feeding motor 474 moves the printing sheet P in the auxiliary scanning direction. The control unit 30 drives the nozzles at appropriate times on the basis of data to be printed, the reciprocating movement (in the main scanning direction) of the carriage 480 and the movement of the printing sheet P (in the auxiliary scanning direction) so that the nozzles form ink dots of appropriate colors at appropriate positions on the printing sheet P. In this manner, the printer 420 can print, on the printing sheet P, a color image on the basis of image data received from the memory card MC.

In the ninth modified example, the printer 420 performs so-called band-pass scanning so that an image is printed. Specifically, as shown in FIG. 25, the printing heads 490 each include nozzle arrays 81 to 84 that eject cyan ink, magenta ink, yellow ink and black ink, respectively. The nozzle arrays 81 to 84 are arranged in the auxiliary scanning direction. For example, the printing head 490 performs the k-th (k is a positive integer) main scanning and forms a dot line (also called a raster in the ninth modified example) that corresponds to the relative position of the printing head 490 to the printing sheet P and extends in the main scanning direction. After the printing head 490 performs the k-th main scanning, the printing sheet P is transported a predetermined distance in the auxiliary scanning direction so that the printing sheet P and the printing head 490 move relative to each other. Then, the printing head 490 performs the k+1-th main scanning and forms a raster that corresponds to the relative position of the printing head 490 (located when the printing head 490 performs the k+1-th main scanning) to the printing sheet P. The same applies to the k+2-th main scanning. FIG. 25 shows the position of the printing head 490 located when the printing head 490 performs each main scanning. In fact, however, the printing sheet P moves in the auxiliary scanning direction in the example shown in FIG. 25.

The relative positions of the printing head 490 (located when the printing head 490 performs the k-th main scanning and the k+1-th main scanning) to the printing sheet P are set so that parts of the nozzle arrays 81 to 84 located when the printing head 490 performs the k-th main scanning overlaps, in the auxiliary scanning direction, parts of the nozzle arrays 81 to 84 located when the printing head 490 performs the k+1-th main scanning. As shown in FIG. 25, the nozzle arrays 81 to 84 each have an upper end portion UN and a lower end portion LN that are located opposite to each other in the auxiliary scanning direction. In FIG. 25, the lower end portions LN of the nozzle arrays 81 to 84 located when the printing head 490 performs the k-th main scanning overlap, in the auxiliary scanning direction, the upper end portions UN of the nozzle arrays 81 to 84 located when the printing head 490 performs the k+1-th main scanning. The overlapping portions UN and LN are also called overlapping regions ORA. The other portion of the nozzle arrays 81 to 84, which does not overlap, is also called a non-overlapping region SA.

The raster that corresponds to the non-overlapping region SA is formed by performing the main scanning once. The raster that corresponds to the overlapping regions ORA is formed by continuously performing the main scanning twice (for example, the k-th main scanning and the k+1-th main scanning).

In an image formed by the printer 420, an irregularity in the density of dots may be generated and the level of granularity may be reduced in a joint region that is constituted by side regions (adjacent to each other) of the bands K and K+1, similarly to an image formed by the printer 20 according to the aforementioned embodiment. However, when the dither mask 61 is generated by the same method as the embodiment or any of the modified examples, an effect that is the same as or similar to the embodiment or the modified example can be obtained. In the process of generating the dither mask 61 and the like in the same method as the embodiment or any of the modified examples, the difference between the preceding head PH and the following head FH may be interpreted as the difference between main scanning performed every odd time and main scanning performed every even time.

B-10. Tenth Modified Example

In the aforementioned embodiment, the printer 20 performs the entire printing process shown in FIG. 3. In a printing system (printing device in a wider sense) in which the printer that is connected to a computer performs the printing process, the whole or a part of the printing process or the whole or a part of the halftone process may be performed by either the computer or the printer. The dither mask 61 may be stored in either the computer or the printer. In addition, the dither mask 61 may be acquired from a node that is connected to a network to which the computer and the printer are connected.

The embodiment of the invention is described above. Among the constituent elements described in the embodiment, elements other than elements described in the independent claims are additional elements and may be omitted or combined. The invention is not limited to the embodiment and may be variously modified without departing from the gist of the invention. For example, the invention can be applied to any of the methods for generating a dither mask; the printing device that stores the dither mask generated by any of the methods; a program that causes the computer to achieve a function of performing the halftone process using the dither mask generated by any of the methods; a program for generating the dither mask; a storage medium that stores the program; and the like.

What is claimed is:

1. A method for manufacturing a printing device that includes a dither mask that is used in a halftone process and in which thresholds are stored in a plurality of storage elements comprising:

configuring the printing device that has a plurality of printing heads arranged in a printing region so that a region of a first one of the printing heads and a region of a second one of the printing heads are adjacent to each other and overlap each other in a direction in which the printing heads are arranged, other regions of the first and second printing heads do not overlap each other in the direction in which the printing heads are arranged, and the printing heads perform printing and eject ink while moving the printing heads relative to the printing medium;

assigning, to some of the storage elements of the dither mask, a first dither mask region that is used for a printing portion of the first printing head, and assigning, to the other storage elements of the dither mask, a second dither mask region that is used for a printing portion of the second printing head, the printing portion of the first printing head being configured to perform printing and included in the overlapping region and non-overlapping region of the first printing head, the printing portion of the second printing head being configured to perform printing and included in the overlapping region and non-overlapping region of the second printing head;

preparing predetermined evaluation values that are used to evaluate the dither mask and each vary depending on whether a threshold that is used for any of the overlapping regions is stored in the first dither mask region or the second dither mask region;

generating the dither mask by determining, using the predetermined evaluation values, the storage elements in which the thresholds are to be stored under the condition that dots are permitted to be formed by the first and second printing heads at the same position in a printing region that corresponds to the overlapping regions; and storing the generated dither mask in a storage medium of the printing device so that a computer is capable of reading the dither mask.

2. The method according to claim 1, wherein the dither mask is generated by:

specifying, for each of rasters, a printing rate that is the ratio of the number of dots that form a part of the raster and are to be formed by the first printing head in the printing region corresponding to the overlapping regions to the number of dots that form the other part of the raster and are to be formed by the second printing head in the printing region corresponding to the overlapping regions, the rasters each being a dot line that extends in a direction perpendicular to the direction in which the printing heads are arranged;

selecting, as a target threshold, one of the thresholds, which is to be stored in any of vacant storage elements that have yet to store any of the thresholds;

selecting, as candidate storage elements, a plurality of candidates for a storage element in which the target threshold is to be stored from among the vacant storage elements included in the first and second dither mask regions on the basis of the printing rates and predetermined requirements that are related to the balance of a dot arrangement, and setting the selected candidate storage elements;

calculating a predetermined evaluation value for each of the candidate storage elements on the basis of an assumption that the target threshold is stored in each of the candidate storage elements; and selecting, from among the candidate storage elements, a candidate storage element for which an evaluation value has been calculated and is most appropriate among the calculated evaluation values, and storing the target threshold in the selected candidate storage element, wherein the evaluation values each include an evaluation value obtained by quantifying a variation in dot coverage that is the ratio of the area of dots to be formed in the printing region that corresponds to the overlapping regions to the area of the printing region that corresponds to the overlapping regions, the variation in the dot coverage being caused by dots that are formed on the printing medium by the first and second printing heads and shifted from each other in a predetermined direction by a predetermined distance, the shifting being caused by the difference between the first and second printing heads, and wherein the selection of one of the thresholds, the selection and setting of a plurality of the candidate storage elements, the calculation of the predetermined evaluation values, and the selection and storage of one of the candidate storage elements are repeated predetermined times so that the dither mask is generated.

3. The method according to claim 2,
wherein when the target threshold is stored in one of the vacant storage elements, the predetermined requirements are that: the first proportion of storage elements that have the thresholds stored therein among storage elements included in each of areas is set to a value so that the difference between the smallest and largest first proportions is minimized, the areas being segmented on the basis of differences between the non-overlapping regions and the overlapping regions and of differences between a printing region that corresponds to parts that are included in the printing portions of the first and second printing heads and in the overlapping regions and perform printing, and printing regions that correspond to the other parts that are included in the printing portions of the first and second printing heads and in the non-overlapping regions and perform printing;
the second proportion of storage elements that have the thresholds stored therein among the storage elements that correspond to the overlapping regions and each of the rasters is set to a value so that the difference between the smallest and largest second proportions is minimized; and
a second printing rate that is the ratio of the number of storage elements that are used for the first printing head and have the thresholds stored therein and correspond to each of the rasters to the number of storage elements that are used for the second printing head and have the thresholds stored therein and correspond to each of the rasters is set to a value so that differences between the specified printing rates and the second printing rates are minimized.

4. The method according to claim 2,
wherein when the target threshold is stored in one of the vacant storage elements, the predetermined requirements are that: the first proportion of storage elements that have the thresholds stored therein among storage elements included in each of areas is in a predetermined range from a value, set so that the first proportions are equal to each other, to a predetermined value, the areas being segmented on the basis of differences between the non-overlapping regions and the overlapping regions and of differences between a printing region that corresponds to parts that are included in the printing portions of the first and second printing heads and in the overlapping regions and perform printing, and printing regions that correspond to the other parts that are included in the printing portions of the first and second printing heads and in the non-overlapping regions and perform printing;
the second proportion of storage elements that have the thresholds stored therein among the storage elements that correspond to the overlapping regions and each of the rasters is in a predetermined range from a value, set so that the second proportions are equal to each other, to a predetermined value; and
a second printing rate that is the ratio of the number of storage elements that are used for the first printing head and have the thresholds stored therein and correspond to each of the rasters to the number of storage elements that are used for the second printing head and have the thresholds stored therein and correspond to each of the rasters is in a predetermined range from the printing rate specified for the raster to a predetermined value.

5. The method according to claim 3,
wherein the predetermined evaluation values are calculated on the basis of an assumption that the target element is stored in one of the vacant storage elements, and each include:
a distribution evaluation value that indicates a distribution of dots that are to be formed by the first or second printing head on the basis of a dot arrangement of storage elements that have the thresholds stored therein and are included in the first or second dither mask region that includes the selected candidate storage element, the first or second printing head corresponding to the first or second dither mask region that includes the selected candidate storage element; and
a coverage evaluation value that is obtained by estimating a plurality of types of shifted patterns that each indicate a state in which dots are to be formed on the printing medium by the first and second printing heads and shifted from each other in a predetermined direction by a predetermined distance due to the difference between the first and second printing heads, calculating, for each of the shifted patterns, the dot coverage in the printing region corresponding to the overlapping regions, and quantifying the variation in the dot coverage.

6. The method according to claim 5, wherein the plurality of types of shifted patterns include a pattern in which not dot is shifted.

7. The method according to claim 5, wherein the coverage evaluation value indicates the variation in the dot coverage that is calculated for the plurality of types of shifted patterns.

8. The method according to claim 1, further comprising storing, in a storage medium of the printing device, a program that causes the computer to achieve a function of correcting an irregularity in the density of a printed image, and a density difference correction table that is used for the correction, the irregularity being caused by the plurality of printing heads and generated in a direction crossing a direction in which a raster extends.

9. A method for manufacturing a printing device that includes a dither mask that is used in a halftone process and in which thresholds are stored in a plurality of storage elements comprising:
configuring the printing device that includes a non-overlapping region and an overlapping region, ejects ink while moving a printing head relative to a printing medium in a main scanning direction and an auxiliary scanning direction, forms a part of a raster by performing main scanning one time in a printing region corresponding to the non-overlapping region, and forms the other part of the raster by continuously performing first and second main scanning in a printing region corresponding to the overlapping region, the raster being a dot line that extends in the main scanning line;
assigning, to some of the storage elements of the dither mask, a first dither mask region that is used for a printing portion that is included in the overlapping region and the non-overlapping region and performs printing with the first main scanning, and assigning, to the other storage elements of the dither mask, a second dither mask region that is used for a printing portion that is included in the overlapping region and the non-overlapping region and performs printing with the second main scanning;
preparing predetermined evaluation values that are used to evaluate the dither mask and each vary depending on whether a threshold that is used for the overlapping region is stored in the first dither mask region or the second dither mask region;

generating the dither mask by determining, using the predetermined evaluation values, the storage elements in which the thresholds are to be stored under the condition that dots are permitted to be formed by the first and second main scanning at the same position in the printing region that corresponds to the overlapping region; and storing the generated dither mask in a storage medium of the printing device so that a computer is capable of reading the dither mask.

10. The method according to claim 9,
wherein the dither mask is generated by:
specifying, for each of rasters, a printing rate that is the ratio of the number of dots that form a part of the raster and are to be formed by the first main scanning in the printing region corresponding to the overlapping region to the number of dots that form the other part of the raster and are to be formed by the second main scanning in the printing region corresponding to the overlapping region;
selecting, as a target threshold, one of the thresholds, which is to be stored in any of vacant storage elements that have yet to store any of the thresholds;
selecting, as candidate storage elements, a plurality of candidates for a storage element in which the target threshold is to be stored from among the vacant storage elements included in the first and second dither mask regions on the basis of the printing rates and predetermined requirements that are related to the balance of a dot arrangement, and setting the selected candidate storage elements;
calculating a predetermined evaluation value for each of the candidate storage elements on the basis of an assumption that the target threshold is stored in each of the candidate storage elements; and
selecting, from among the candidate storage elements, a candidate storage element for which an evaluation value has been calculated and is most appropriate among the calculated evaluation values,
wherein the evaluation values each include an evaluation value obtained by quantifying a variation in dot coverage that is the ratio of the area of dots to be formed on the printing medium in the printing region corresponding to the overlapping region to the area of the printing region corresponding to the overlapping region, the variation in the dot coverage being caused by dots that are formed on the printing medium by the first and second scanning and shifted from each other in a predetermined direction by a predetermined distance, the shifting being caused by the difference between the first scanning and the second scanning, and
wherein the selection of one of the thresholds, the selection and setting of a plurality of the candidate storage elements, the calculation of the predetermined evaluation values, and the selection and storage of one of the candidate storage elements are repeated predetermined times so that the dither mask is generated.

11. The method according to claim 10,
wherein when the target threshold is stored in one of the vacant storage elements, the predetermined requirements are that: the first proportion of storage elements that have the thresholds stored therein among storage elements included in each of areas is set to a value so that the difference between the smallest and largest first proportions is minimized, the areas being segmented on the basis of the difference between the non-overlapping region and the overlapping region and of the difference between a region formed by the main scanning performed by a portion of the printing head and a region formed by the first and second main scanning performed by the printing portions of the printing head;
the second proportion of storage elements that have the thresholds stored therein among the storage elements that correspond to the overlapping region and each of the rasters is set to a value so that the difference between the smallest and largest second proportions is minimized; and
a second printing rate that is the ratio of the number of storage elements that are used for the region in which the printing is performed with the first main scanning and have the thresholds stored therein and correspond to each of the rasters to the number of storage elements that are used for the region in which the printing is performed with the second main scanning and have the thresholds stored therein and correspond to each of the rasters is set to a value so that differences between the specified printing rates and the second printing rates are minimized.

12. The method according to claim 10,
wherein when the target threshold is stored in one of the vacant storage elements, the predetermined requirements are that: the first proportion of storage elements that have the thresholds stored therein among storage elements included in each of areas is in a predetermined range from a value, set so that the first proportions are equal to each other, to a predetermined value, the areas being segmented on the basis of the difference between the non-overlapping region and the overlapping region and of the difference between a region formed by the main scanning performed by a portion of the printing head and a region formed by the first and second main scanning performed by the printing portions of the printing head;
the second proportion of storage elements that have the thresholds stored therein among the storage elements that correspond to the overlapping region and each of the rasters is in a predetermined range from a value, set so that the second proportions are equal to each other, to a predetermined value; and
a second printing rate that is the ratio of the number of storage elements that are used for the region in which the printing is performed with the first main scanning and have the thresholds stored therein and correspond to each of the rasters to the number of storage elements that are used for the region in which the printing is performed with the second main scanning and have the thresholds stored therein and correspond to each of the rasters is in a predetermined range from the printing rate specified for the raster to a predetermined value.

13. The method according to claim 11,
wherein the predetermined evaluation values are calculated on the basis of an assumption that the target element is stored in one of the vacant storage elements, and each include:
a distribution evaluation value that indicates a distribution of dots to be formed by the main scanning on the basis of a dot arrangement of storage elements that have the thresholds stored therein and are included in the first or second dither mask region that includes the selected candidate storage element, the main scanning corresponding to the first or second dither mask region that includes the selected candidate storage element; and
a coverage evaluation value that is obtained by estimating a plurality of types of shifted patterns that each indicate a state in which dots are to be formed on the printing medium by the first and second main scanning and shifted from each other in a predetermined direction by a predetermined distance due to the difference between the first and second main scanning, calculating, for each of the shifted patterns, the dot coverage in the printing region corresponding to the overlapping region, and quantifying the variation in the dot coverage.

14. The method according to claim 13, wherein the plurality of types of shifted patterns include a pattern in which no dot is shifted.

15. The method according to claim 13, wherein the coverage evaluation value indicates the variation in the dot coverage calculated for the plurality of types of shifted patterns.

16. The method according to claim 9, further comprising storing, in a storage medium of the printing device, a program that causes the computer to achieve a function of correcting an irregularity in the density of a printed image, and a density difference correction table that is used for the correction, the irregularity being caused by the difference between the first and second main scanning that is continuously performed and being generated in the printing region corresponding to the overlapping region in a direction crossing a direction in which a raster extends.

\* \* \* \* \*